(12) United States Patent
Kim et al.

(10) Patent No.: US 11,616,204 B2
(45) Date of Patent: Mar. 28, 2023

(54) ORGANIC ELECTROLUMINESCENCE DEVICE AND ORGANOMETALLIC COMPOUND FOR ORGANIC ELECTROLUMINESCENCE DEVICE

(71) Applicant: Samsung Display Co., Ltd., Yongin-si (KR)

(72) Inventors: Haejin Kim, Hwaseong-si (KR); Soo-Byung Ko, Yongin-si (KR); Sungbum Kim, Yongin-si (KR); Eunsoo Ahn, Jinju-si (KR); Jaesung Lee, Hwaseong-si (KR); Hyunjung Lee, Pohang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 187 days.

(21) Appl. No.: 16/987,590

(22) Filed: Aug. 7, 2020

(65) Prior Publication Data

US 2021/0175442 A1   Jun. 10, 2021

(30) Foreign Application Priority Data

Dec. 9, 2019   (KR) .................. 10-2019-0162783

(51) Int. Cl.
*H01L 51/00* (2006.01)

(52) U.S. Cl.
CPC ................. *H01L 51/0085* (2013.01)

(58) Field of Classification Search
CPC .................................................. H01L 51/0085
See application file for complete search history.

(56) References Cited

U.S. PATENT DOCUMENTS 7,999,103 B2    8/2011   Haga et al.
8,580,961 B2   11/2013   Chi et al.
(Continued)

FOREIGN PATENT DOCUMENTS

CN          106928281 A    7/2017
KR    10-2008-0081277 A    9/2008
TW          201723143 A    7/2017

*Primary Examiner* — Victor A Mandala
*Assistant Examiner* — Colleen E Snow
(74) *Attorney, Agent, or Firm* — Lewis Roca Rothgerber Christie LLP

(57) ABSTRACT

An organic electroluminescence device includes a first electrode; an emission layer on the first electrode; and a second electrode on the emission layer, wherein the emission layer comprises an organometallic compound represented by Formula 1, and the organic electroluminescence device can achieve long life and deep blue light emission:

Formula 1

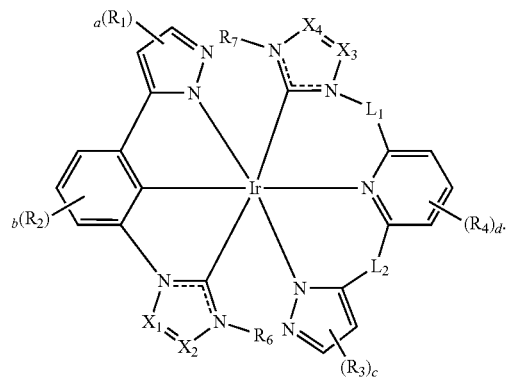

21 Claims, 2 Drawing Sheets

(56) References Cited

U.S. PATENT DOCUMENTS

| | | |
|---|---|---|
| 9,219,237 B1 | 12/2015 | Chi et al. |
| 9,553,277 B2 | 1/2017 | Chi et al. |
| 9,748,504 B2 | 8/2017 | Xia et al. |
| 10,008,680 B2 | 6/2018 | Chi et al. |
| 10,153,442 B2 | 12/2018 | Chi et al. |
| 2016/0355534 A1 | 12/2016 | Chi et al. |
| 2019/0153009 A1 | 5/2019 | Tsai et al. |

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATION

This claims priority to and the benefit of Korean Patent Application No. 10-2019-0162783, filed on Dec. 9, 2019, the entire content of which is hereby incorporated by reference.

BACKGROUND

1. Field

One or more aspects of embodiments of the present disclosure herein relate to an organic electroluminescence device and an organometallic compound used therein.

2. Description of the Related Art

As an image display device, the development of an organic electroluminescence device is being actively conducted. The organic electroluminescence device is a self-luminescent display device in which holes and electrons injected from a first electrode and a second electrode, respectively, recombine in an emission layer, and a light-emitting material, which is an organic compound included in the emission layer, emits light.

As the organic electroluminescence device, for example, an organic device composed of a first electrode, a hole transport layer disposed on the first electrode, an emission layer disposed on the hole transport layer, an electron transport layer disposed on the emission layer, and a second electrode disposed on the electron transport layer, is known. Holes are injected from the first electrode, and the holes thus injected move through the hole transport layer and are injected into the emission layer. Meanwhile, electrons are injected from the second electrode, and the electrons thus injected move through the electron transport layer and are injected into the emission layer. Through the recombination of the holes and electrons injected into the emission layer, excitons are produced in the emission layer. The organic electroluminescence device emits light using light generated through the transition of the excitons back to a ground state.

In the application of an organic electroluminescence device to a display device, the increase of the life of the organic electroluminescence device is required (or desired), and the development of a material for an organic electroluminescence device stably accomplishing the effect is consistently required (or desired).

SUMMARY

One or more aspects of embodiments of the present disclosure provides an organic electroluminescence device having long life (long lifespan) and an organometallic compound used therein.

An organic electroluminescence device according to an embodiment of the present disclosure may include a first electrode, an emission layer disposed on the first electrode, and a second electrode disposed on the emission layer. The emission layer may include an organometallic compound including an iridium atom, and a first ligand and a second ligand, which are combined with the iridium atom. The first ligand may include a substituted or unsubstituted phenyl ligand, a substituted or unsubstituted pyrazole ligand combined with the phenyl ligand, and a substituted or unsubstituted five-member ring N-heterocyclic carbene ligand combined with the phenyl ligand. The second ligand may include a substituted or unsubstituted pyridine ligand, a substituted or unsubstituted pyrazole ligand combined with the pyridine ligand, and a substituted or unsubstituted five-member ring N-heterocyclic carbene ligand combined with the pyridine ligand.

In an embodiment, the substituted or unsubstituted five-member ring N-heterocyclic carbene ligand in each of the first ligand and the second ligand may be a substituted or unsubstituted imidazole N-heterocyclic carbene derivative.

In an embodiment, the substituted or unsubstituted five-member ring N-heterocyclic carbene ligand in each of the first ligand and the second ligand may be a substituted or unsubstituted imidazole-2-ylidene, a substituted or unsubstituted benzimidazol-2-ylidene, or a substituted or unsubstituted imidazo pyrazine-2-ylidene.

In an embodiment, the emission layer may include a host and a dopant. The dopant may include the organometallic compound.

In an embodiment, the emission layer may emit blue light.

In an embodiment, a difference $\Delta(^3MLCT-^3MC)$ between a $^3MLCT$ energy level and a $^3MC$ energy level of the organometallic compound may be from about 12 eV to about 16 eV.

In an embodiment, the emission layer may emit light having a central wavelength of about 430 nm to about 490 nm.

In an embodiment, the organometallic compound may be represented by the following Formula 1:

Formula 1

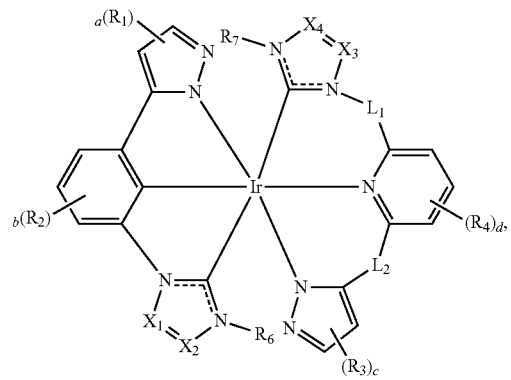

in Formula 1, $X_1$ to $X_4$ may be each independently $CR_5$ or N. $R_1$ to $R_5$ may be each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring. $R_6$ and $R_7$ may be each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring. $L_1$ and $L_2$ may be each independently a direct linkage, an oxygen atom, a sulfur atom, a substituted or unsubstituted divalent alkyl group of 1 to 20 carbon atoms, a substituted or unsubstituted divalent silyl group, a substituted or unsubstituted arylene group of 6 to 30 carbon atoms for forming a ring, or a substituted or unsubstituted heteroarylene group of 2 to 30 carbon atoms for forming a ring. "a" and "c" may be each independently an integer of 0 to 2. "b" and "d" may be each independently an integer of 0 to 3.

In an embodiment, Formula 1 may be represented by the following Formula 1-1:

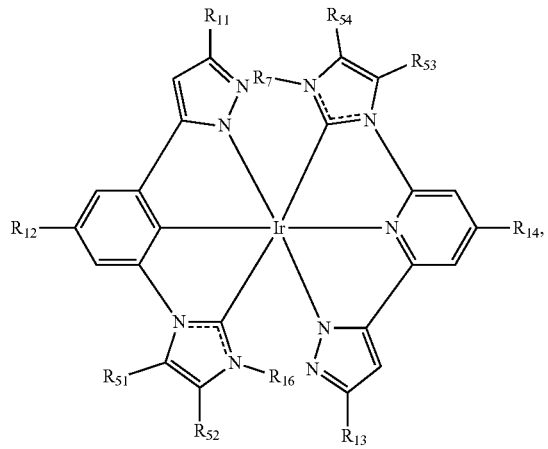

Formula 1-1 in Formula 1-1, $R_{11}$ to $R_{14}$ may be each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring. $R_{16}$ and $R_{17}$ may be each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring. $R_{51}$ to $R_{54}$ may be each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring.

In an embodiment, Formula 1 may be represented by the following Formula 1-2:

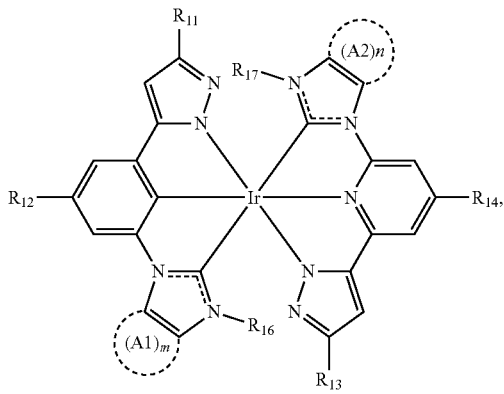

Formula 1-2 in Formula 1-2, A1 and A2 may be each independently a substituted or unsubstituted aryl group of 6 to 30 carbon atoms for forming a ring, or a substituted or unsubstituted heteroaryl group of 2 to 30 carbon atoms for forming a ring. $R_{11}$ to $R_{14}$ may be each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring. $R_{16}$ and $R_{17}$ may be each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring. "m" and "n" may be each independently 0 or 1.

In an embodiment, $R_1$ to $R_4$ may be each independently an unsubstituted methyl group, an unsubstituted ethyl group, an unsubstituted isopropyl group, an unsubstituted t-butyl group, a cyano group, a trifluoromethyl group, a methyl-$d_3$ group, an unsubstituted cyclohexyl group, or an alkyl-substituted phenyl group. $R_6$ and $R_7$ may be each independently an unsubstituted methyl group, an unsubstituted ethyl group, an unsubstituted isopropyl group, an unsubstituted t-butyl group, a methyl-$d_3$ group, or an alkyl-substituted phenyl group.

In an embodiment, the emission layer may include at least one selected from compounds represented in the following Compound Group 1:

Compound Group 1
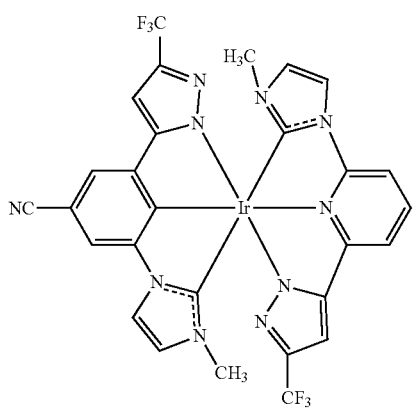
1
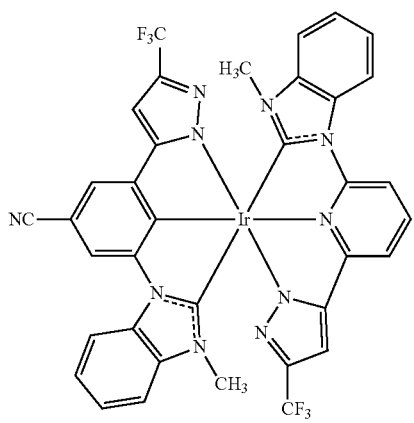
2
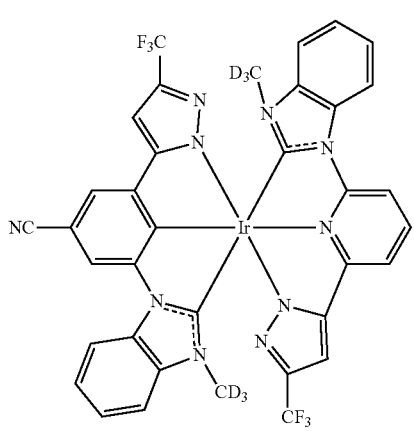
3
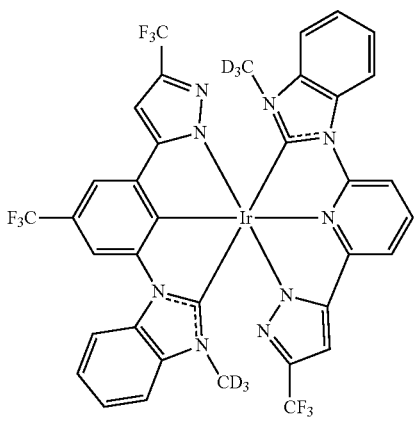
4
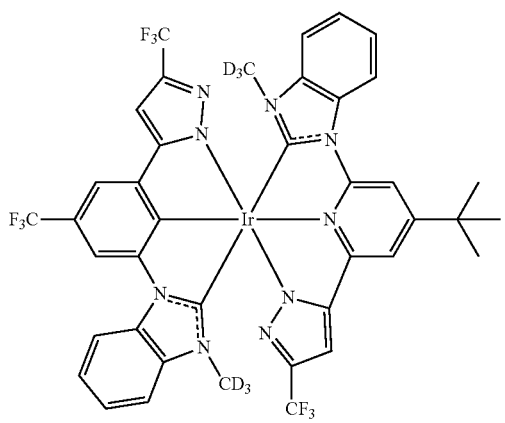
5
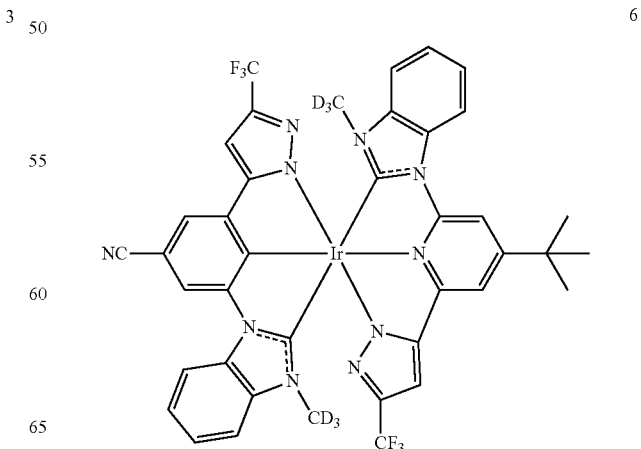
6

7
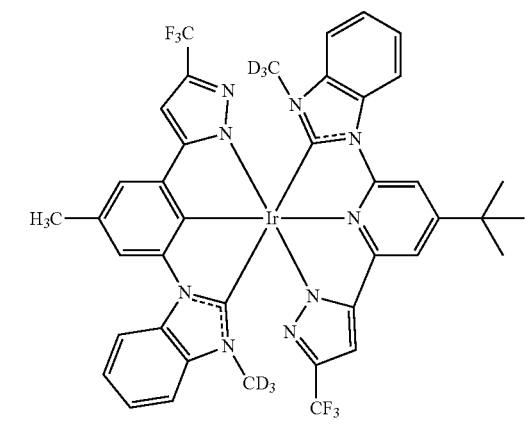
8
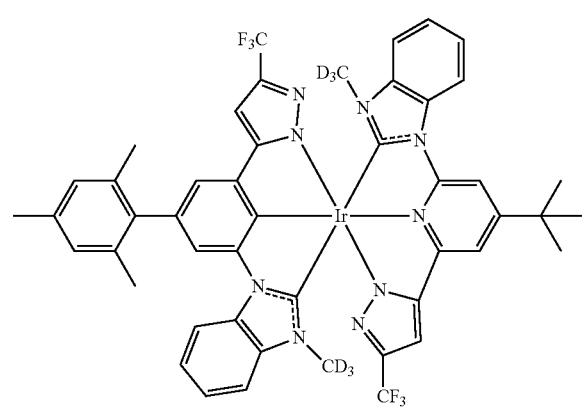
9
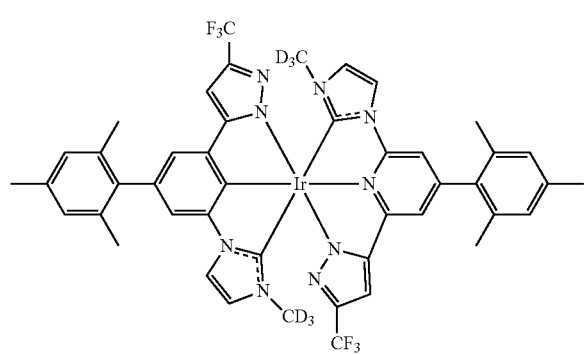
10
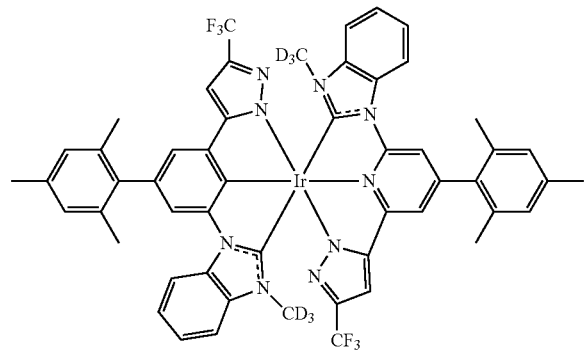
11
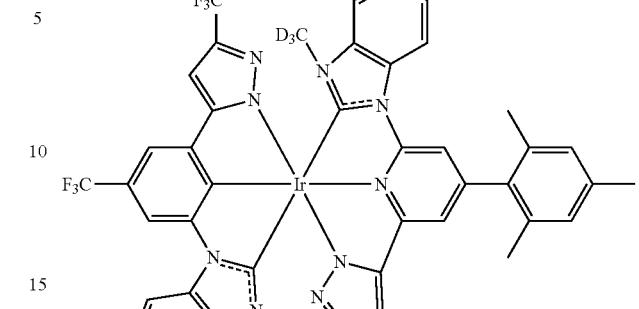
12
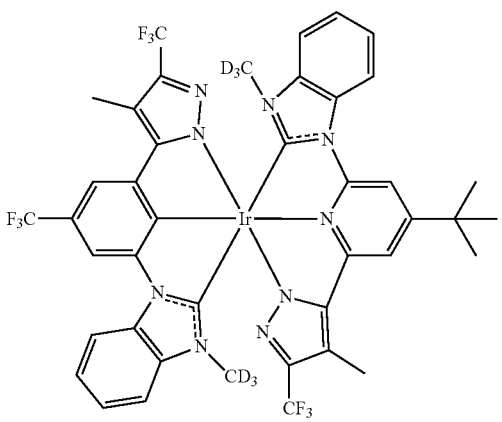
13
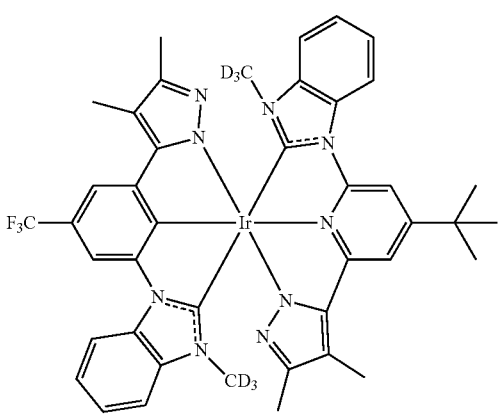

14
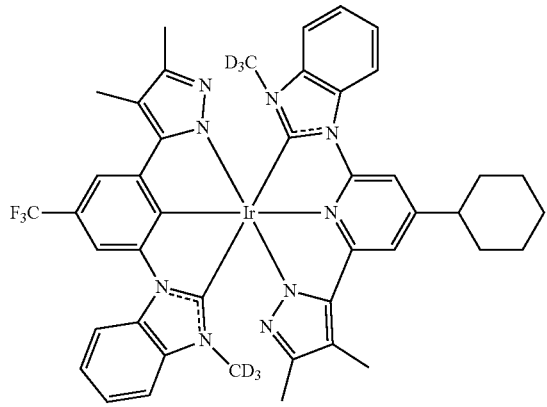
15
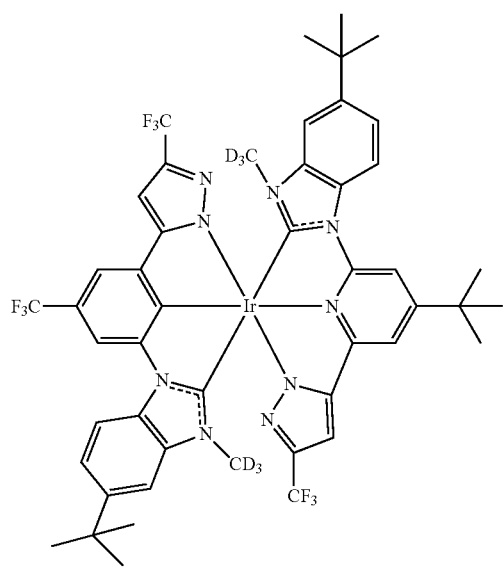
16
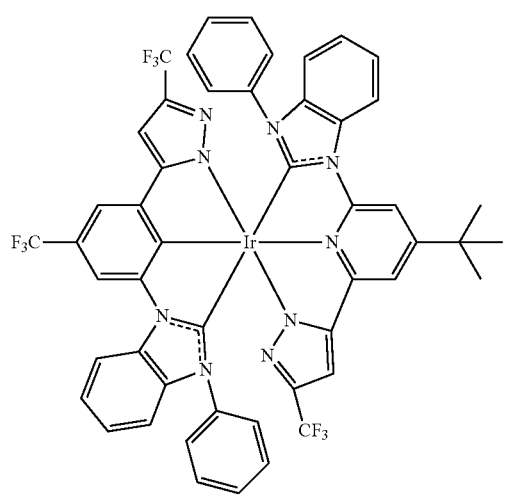
17
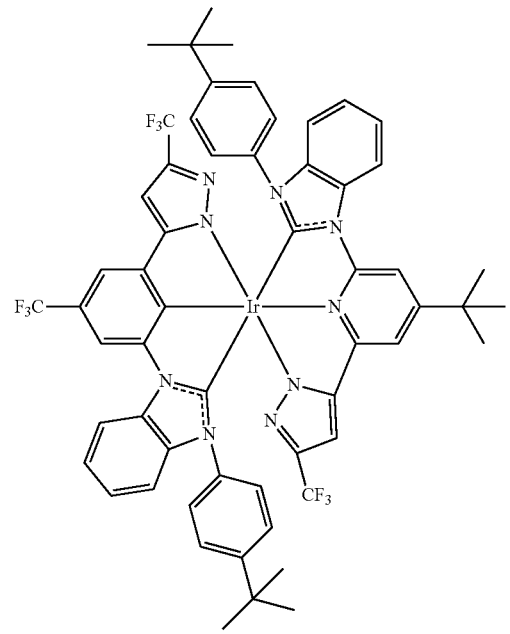
18
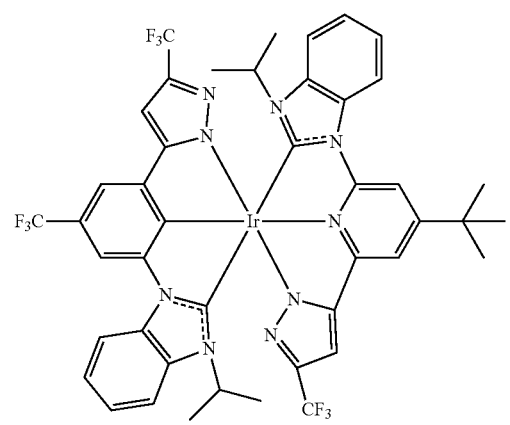
19
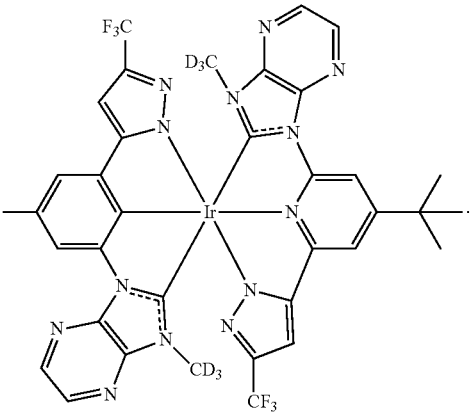
In an embodiment of the present disclosure, an organic electroluminescence device may further include a hole transport region between the first electrode and the emission layer, and an electron transport region between the emission layer and the second electrode.
In an embodiment of the present disclosure, the organometallic compound may be provided.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
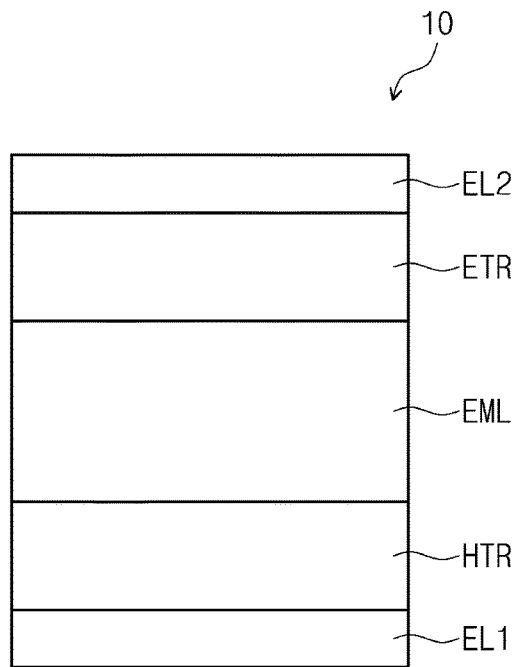
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

It will also be understood that when a layer, a film, a region, a plate, etc. is referred to as being "on" or "above" another part, it can be directly on the other part (without any intervening layers therebetween), or intervening layers may also be present. Similarly, it will also be understood that when a layer, a film, a region, a plate, etc. is referred to as being "under" or "below" another part, it can be directly under the other part (without any intervening layers therebetween), or intervening layers may also be present. Also, when an element is referred to as being "on" another element, it can be under the other element.

In the description, the term "substituted or unsubstituted" corresponds to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may itself be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In some embodiments, the ring formed via the combination with an adjacent group may be combined with another ring to form a spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may be a fluorine atom, a chlorine atom, a bromine atom, or an iodine atom.

In the description, the alkyl (e.g., alkyl group) may be a linear, branched or cyclic group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the hydrocarbon ring group may refer to a functional group or substituent derived from an aliphatic hydrocarbon ring. The hydrocarbon ring group may be a saturated hydrocarbon ring group of 5 to 20 carbon atoms for forming a ring.

In the description, the aryl group may refer to a functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the heterocyclic group may include one or more selected from B, O, N, P, Si and S as ring-forming heteroatoms. If the heterocyclic group includes two or more heteroatoms, two or more heteroatoms may be the same or different. The heterocyclic group may be a monocyclic heterocyclic group or a polycyclic heterocyclic group, and may include a heteroaryl group. The carbon number for forming a ring of the heteroaryl group may be 2 to 30, 2 to 20, or 2 to 10.

In the description, the aliphatic heterocyclic group may include one or more selected from B, O, N, P, Si and S as ring-forming heteroatoms. The carbon number for forming a ring of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, the carbon number for forming a ring of the heteroaryl group may be 2 to 30, 2 to 20, or 2 to 10. Examples of the heteroaryl group may include thiophene, furan, pyrrole, imidazole, thiazole, oxazole, oxadiazole, pyridine, bipyridine, pyrimidine, triazine, triazole, acridine, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, isooxazole, thiadiazole, phenothiazine, dibenzosilole, dibenzofuran, etc., without limitation.

In the description, the explanation for the aryl group may be applied to the arylene group except that the arylene group is a divalent group. The explanation for the heteroaryl group may be applied to the heteroarylene group except that the heteroarylene group is a divalent group.

In the description, the silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the thio group may include an alkyl thio group and an aryl thio group.

In the description, the oxy group may include an alkoxy group and an aryl oxy group. The alkoxy group may be a linear chain, a branched chain or a cyclic chain. The carbon number of the alkoxy group is not specifically limited, but may be, for example, 1 to 20 or 1 to 10. Examples of the oxy group include methoxy, ethoxy, n-propoxy, isopropoxy, butoxy, pentyloxy, hexyloxy, octyloxy, nonyloxy, decyloxy, benzyloxy, etc., without limitation.

In the description, the boron group includes an alkyl boron group and an aryl boron group. Examples of the boron group include a trimethylboron group, a triethylboron group, a t-butyldimethylboron group, a triphenylboron group, a diphenylboron group, a phenylboron group, etc., without limitation.

In the description, the alkenyl group may be a linear or a branched hydrocarbon group with at least one carbon-carbon double bond in the chain thereof. The carbon number of the alkenyl group is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the carbon number of the amine group is not specifically limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methylanthracenylamine group, a triphenylamine group, etc., without limitation.

In the description, examples of the alkyl group in an alkylthio group, an alkylaryl group, an alkylamino group, an alkyl boron group, an alkyl silyl group and an alkyl amine group are the same as the alkyl group described above.

In the description, examples of the aryl group in an aryloxy group, an arylthio group, an arylamino group, an aryl boron group, an aryl silyl group, and an aryl amine group are the same as the aryl group described above.

In the description, direct linkage may mean a single bond.

In the description, "carbon atoms for forming a ring" may refer to ring-forming carbon atoms.

FIG. 1 is a cross-sectional view schematically showing an organic electroluminescence device according to an embodiment of the present disclosure. The organic electroluminescence device 10 according to an embodiment may include a first electrode EL1, a hole transport region HTR, an emission layer EML, an electron transport region ETR, and a second electrode EL2 stacked in this order.

FIGS. 1 to 4 are cross-sectional views schematically showing organic electroluminescence devices according to example embodiments of the present disclosure. Referring to FIGS. 1 to 4, in an organic electroluminescence device 10 according to an embodiment, a first electrode EL1 and a second electrode EL2 are oppositely positioned, and between the first electrode EL1 and the second electrode EL2, an emission layer EML may be provided.

The organic electroluminescence device 10 of an embodiment may further include a plurality of functional groups (e.g., functional layers) between the first electrode EL1 and the second electrode EL2, in addition to the emission layer EML. The plurality of the functional groups may include a hole transport region HTR and an electron transport region ETR. For example, the organic electroluminescence device 10 of an embodiment may include a first electrode EL1, a hole transport region HTR, an emission layer EML, an electron transport region ETR, and a second electrode EL2, stacked in this order. In some embodiments, the organic electroluminescence device 10 of an embodiment may include a capping layer CPL disposed on the second electrode EL2.

The organic electroluminescence device 10 of an embodiment may include a compound of an embodiment, which will be explained in more detail herein below, in the emission layer EML which is between the first electrode EL1 and the second electrode EL2. However, an embodiment of the present disclosure is not limited thereto, and the organic electroluminescence device 10 of an embodiment may include the compound of an embodiment in the hole transport region HTR or the electron transport region ETR, which are functional groups between the first electrode EL1 and the second electrode EL2, or include the compound of an embodiment in the capping layer CPL on the second electrode EL2.

Figure 2:
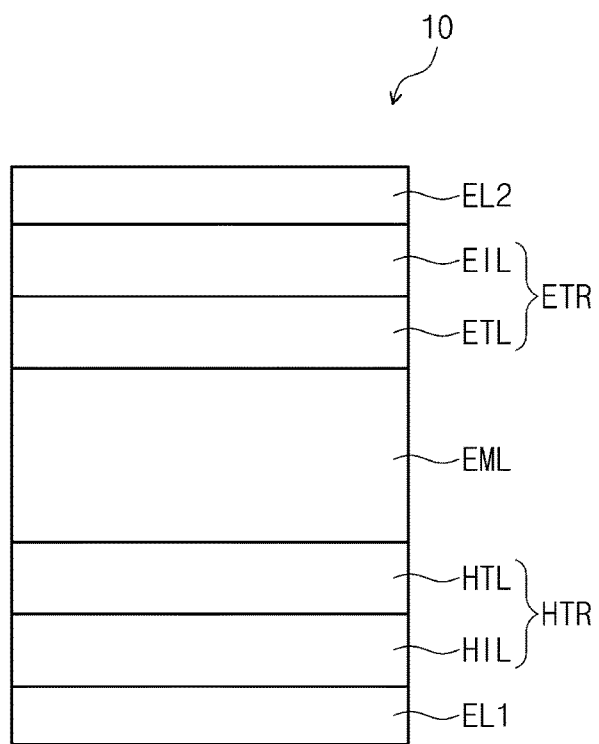
FIG. 2 is a cross-sectional view schematically illustrating an organic electroluminescence device according to an embodiment of the present disclosure.
Figure 3:
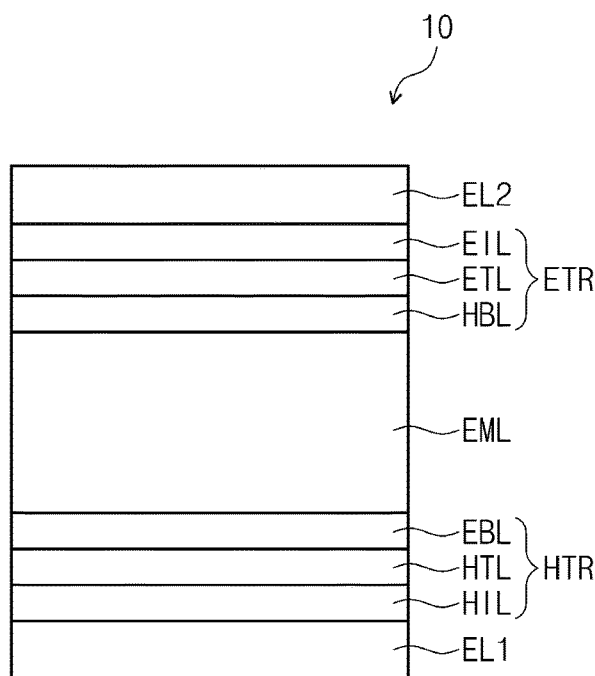
FIG. 3 is a cross-sectional view schematically illustrating an organic electroluminescence device according to an embodiment of the present disclosure.
Figure 4:
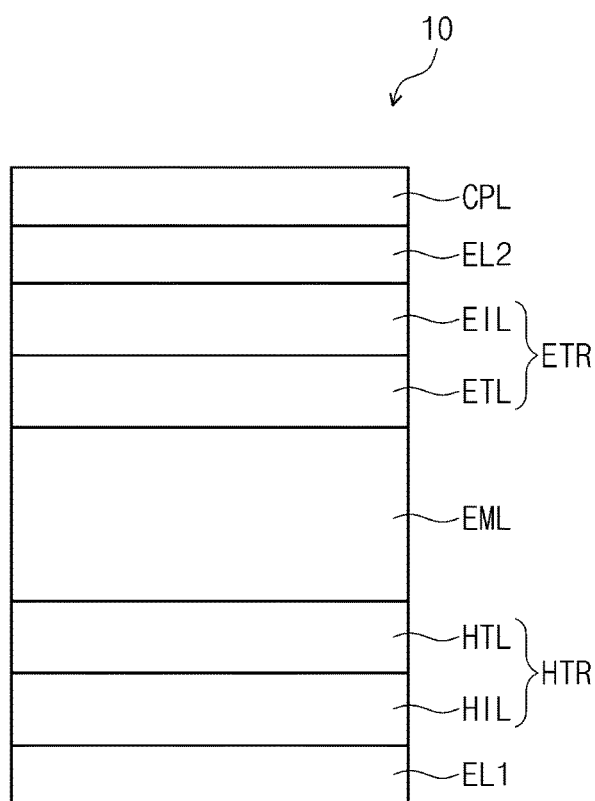
FIG. 4 is a cross-sectional view schematically illustrating an organic electroluminescence device according to an embodiment of the present disclosure.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. When compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of an embodiment, including a capping layer CPL disposed on the second electrode EL2.

The first electrode EL1 has conductivity. The first electrode EL1 may be formed using a metal alloy or any suitable conductive compound. The first electrode EL1 may be an anode. In some embodiments, the first electrode EL1 may be a pixel electrode. The first electrode EL1 may be a transmissive electrode, a transflective electrode, or a reflective electrode. If the first electrode EL1 is the transmissive electrode, the first electrode EL1 may include a transparent metal oxide, for example, indium tin oxide (ITO), indium zinc oxide (IZO), zinc oxide (ZnO), indium tin zinc oxide (ITZO), etc. If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a structure including a plurality of layers including a reflective layer or a transflective layer formed using any of the above materials, and a transmissive conductive layer formed using ITO, IZO, ZnO, ITZO, etc. For example, the first electrode EL1 may include a three-layer structure of ITO/Ag/ITO. However, an embodiment of the present disclosure is not limited thereto. The thickness of the first electrode EL1 may be from about 1,000 Å to about 10,000 Å, for example, from about 1,000 Å to about 3,000 Å.

The hole transport region HTR may be on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of the hole injection layer HIL or the hole transport layer HTL, or a single layer structure formed using a hole injection material and a hole transport material. In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-tris(3-methylphenylphenylamino) triphenylamine (m-MTDATA), 4,4',4''-tris(N,N-diphenylamino)triphenylamine (TDATA), 4,4',4''-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenylbenzidine (NPB), triphenylamine-containing polyetherketone (TPAPEK), 4-isopropyl-4'-methyldiphenyliodonium tetrakis(pentafluorophenyl)borate, and/or dipyrazino[2,3-f:2',3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis (3-methylphenyl)-N,N'-diphenyl-[1,1-biphenyl]-4,4'-diamine (TPD), triphenylamine-based derivatives (such as 4,4',4''-tris(carbazol-9-yl)triphenylamine (TCTA)), N,N'-di (naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), etc.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory (or suitable) hole transport properties may be achieved without substantial increase of a driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. Non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc., without limitation.

As described above, the hole transport region HTR may further include at least one of a hole butter layer or an electron blocking layer EBL, in addition to the hole injection layer HIL and the hole transport layer HTL. The hole buffer layer may compensate an optical resonance distance according to the wavelength of light emitted from an emission layer EML to increase light emission efficiency. Materials which may be included in the hole transport region HTR may be used as materials included in the hole buffer layer. The electron blocking layer EBL may prevent or reduce electron injection from the electron transport region ETR into the hole transport region HTR.

The emission layer EML may be on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of an embodiment, an emission layer EML may include the organometallic compound of an embodiment.

The organometallic compound of an embodiment may include an iridium atom, and a first ligand and a second ligand, which are combined with the iridium atom. Each of the first ligand and the second ligand may have an asymmetric structure. Each of the first ligand and the second ligand may be a tridentate ligand.

The first ligand may include a phenyl ligand, a pyrazole ligand, and/or an N-heterocyclic carbene ligand. The phenyl ligand may be a substituted or unsubstituted phenyl ligand. The pyrazole ligand may be a substituted or unsubstituted pyrazole ligand. The N-heterocyclic carbene ligand may be a substituted or unsubstituted five-member ring N-heterocyclic carbene ligand. The pyrazole ligand and the N-heterocyclic carbene ligand may be combined with the phenyl ligand. For example, the first ligand may be a moiety in which the pyrazole ligand and the N-heterocyclic carbene ligand are combined with the phenyl ligand as a center.

The second ligand may include a pyridine ligand, a pyrazole ligand, and/or an N-heterocyclic carbene ligand. The pyridine ligand may be a substituted or unsubstituted pyridine ligand. The pyrazole ligand may be a substituted or unsubstituted pyrazole ligand. The N-heterocyclic carbene ligand may be a substituted or unsubstituted five-member ring N-heterocyclic carbene ligand. The pyrazole ligand and the N-heterocyclic carbene ligand may be combined with the pyridine ligand. For example, the second ligand may be a moiety in which the pyrazole ligand and the N-heterocyclic carbene ligand are combined with the pyridine ligand as a center.

The substituted or unsubstituted five-member ring N-heterocyclic carbene ligand in each of the first ligand and the second ligand may be a substituted or unsubstituted imidazole N-heterocyclic carbene derivative. In the description, the imidazole N-heterocyclic carbene derivative may refer to an imidazole-based N-heterocyclic carbene derivative. For example, the imidazole N-heterocyclic carbene derivative may be imidazole-2-ylidene derivative. The imidazole-2-ylidene derivative may be a substituted or unsubstituted imidazole-2-ylidene, a substituted or unsubstituted benzimidazol-2-ylidene, or a substituted or unsubstituted imidazo pyrazine-2-ylidene.

In an embodiment, at least one of the first ligand or the second ligand may include at least one electron withdrawing group as a substituent. For example, at least one of the first ligand or the second ligand may include a trifluoromethyl group as a substituent.

The difference [$\Delta(^3\text{MLCT-}^3\text{MC})$] between a triplet metal-to-ligand charge transfer state ($^3$MLCT) energy level and a triplet metal centered state ($^3$MC) energy level of the organometallic compound of an embodiment may be about 12 eV or more. For example, the $\Delta(^3\text{MLCT-}^3\text{MC})$ value of the organometallic compound of an embodiment may be from about 12 eV to about 16 eV, or from about 12.5 eV to about 15 eV.

The organometallic compound of an embodiment may be represented by the following Formula 1:

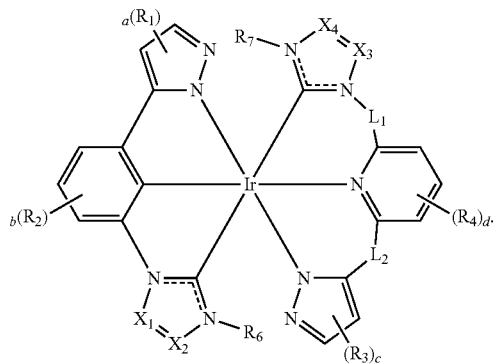

Formula 1

In Formula 1, $X_1$ to $X_4$ may be each independently $CR_5$ or N. $R_1$ to $R_5$ may be each independently a hydrogen atom, a deuterium atom, a halogen atom, a cyano group, a thio group, an oxy group, a silyl group, a boron group, an amine group, an alkyl group, an alkenyl group, an aryl group, or a heteroaryl group, and/or may be combined with an adjacent group to form a ring. The thio group may be a substituted or unsubstituted thio group. The oxy group may be a substituted or unsubstituted oxy group. The silyl group may be a substituted or unsubstituted silyl group. The boron group may be a substituted or unsubstituted boron group. The amine group may be a substituted or unsubstituted amine group. The alkyl group may be a substituted or unsubstituted alkyl group of 1 to 20 carbon atoms. The alkenyl group may be a substituted or unsubstituted alkenyl group of 2 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

$R_6$ and $R_7$ may be each independently a hydrogen atom, a deuterium atom, an alkyl group, an alkenyl group, an aryl group, or a heteroaryl group, or may be combined with an adjacent group to form a ring. The alkyl group may be a substituted or unsubstituted alkyl group of 1 to 20 carbon atoms. The alkenyl group may be a substituted or unsubstituted alkenyl group of 2 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

$L_1$ and $L_2$ may be each independently a direct linkage, an oxygen atom, a sulfur atom, a divalent alkyl group, a divalent silyl group, an arylene group, or a heteroarylene group. The divalent alkyl group may be a substituted or unsubstituted divalent alkyl group of 1 to 20 carbon atoms. The divalent silyl group may be a substituted or unsubstituted divalent silyl group. The arylene group may be a substituted or unsubstituted arylene group of 6 to 30 carbon atoms for forming a ring. The heteroarylene group may be a substituted or unsubstituted heteroarylene group of 2 to 30 carbon atoms for forming a ring.

"a" and "c" may be each independently an integer of 0 to 2. "b" and "d" may be each independently an integer of 0 to 3.

Formula 1 may be represented by the following Formula 1-1:

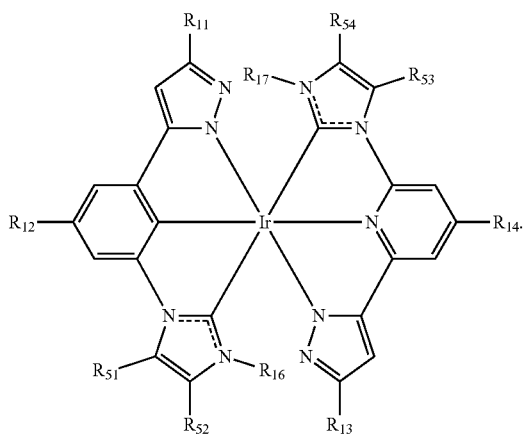

Formula 1-1

Formula 1-1 corresponds to Formula 1, where $X_1$ to $X_4$ and "a" to "d" are defined, and $R_1$ to $R_7$ have specific substitution positions.

In Formula 1-1, $R_{11}$ to $R_{14}$ may be each independently a hydrogen atom, a deuterium atom, a halogen atom, a cyano group, a thio group, an oxy group, a silyl group, a boron group, an amine group, an alkyl group, an alkenyl group, an aryl group, or a heteroaryl group. The thio group may be a substituted or unsubstituted thio group. The oxy group may be a substituted or unsubstituted oxy group. The silyl group may be a substituted or unsubstituted silyl group. The boron group may be a substituted or unsubstituted boron group. The amine group may be a substituted or unsubstituted amine group. The alkyl group may be a substituted or unsubstituted alkyl group of 1 to 20 carbon atoms. The alkenyl group may be a substituted or unsubstituted alkenyl group of 2 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

$R_{16}$ and $R_{17}$ may be each independently a hydrogen atom, a deuterium atom, an alkyl group, an alkenyl group, an aryl group, or a heteroaryl group. The alkyl group may be a substituted or unsubstituted alkyl group of 1 to 20 carbon atoms. The alkenyl group may be a substituted or unsubstituted alkenyl group of 2 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

$R_{51}$ to $R_{54}$ may be each independently a hydrogen atom, a deuterium atom, a halogen atom, a cyano group, a thio group, an oxy group, a silyl group, a boron group, an amine group, an alkyl group, an alkenyl group, an aryl group, or a heteroaryl group, and/or combined with an adjacent group to form a ring. The thio group may be a substituted or unsubstituted thio group. The oxy group may be a substituted or unsubstituted oxy group. The silyl group may be a substituted or unsubstituted silyl group. The boron group may be a substituted or unsubstituted boron group. The amine group may be a substituted or unsubstituted amine group. The alkyl group may be a substituted or unsubstituted alkyl group of 1 to 20 carbon atoms. The alkenyl group may be a substituted or unsubstituted alkenyl group of 2 to 20 carbon atoms. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring.

Formula 1 or Formula 1-1 may be represented by Formula 1-2.

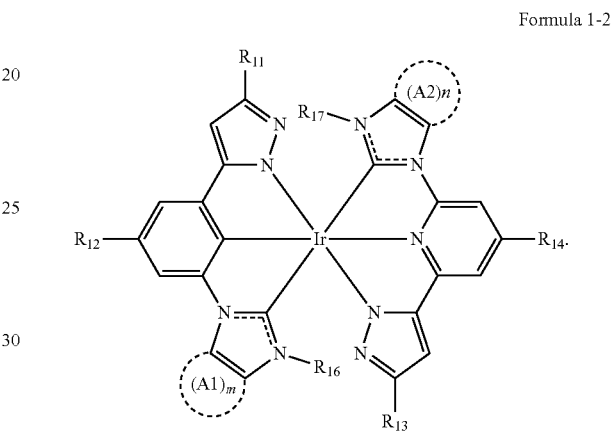

Formula 1-2

In Formula 1-2, A1 and A2 may be each independently an aryl group, or a heteroaryl group. The aryl group may be a substituted or unsubstituted aryl group of 6 to 30 carbon atoms for forming a ring. The heteroaryl group may be a substituted or unsubstituted heteroaryl group of 2 to 30 carbon atoms for forming a ring. "m" and "n" may be each independently 0 or 1. For example, both "m" and "n" may be 1 or 0.

$R_{11}$ to $R_{14}$, $R_{16}$ and $R_{17}$ may be the same as defined in the above-described Formula 1-1.

For example, A1 and A2 may be each independently a substituted or unsubstituted benzene ring, or a substituted or unsubstituted pyrazine ring.

In Formula 1, Formula 1-1, and Formula 1-2, $R_1$ to $R_4$ and $R_{11}$ to $R_{14}$ may be each independently a methyl group, an ethyl group, an isopropyl group, a t-butyl group, a cyano group, a trifluoromethyl group, a methyl-$d_3$ group, a cyclohexyl group, or a substituted or unsubstituted phenyl group.

In Formula 1, Formula 1-1, and Formula 1-2, $R_6$, $R_7$, $R_{16}$ and $R_{17}$ may be each independently a methyl group, an ethyl group, an isopropyl group, a t-butyl group, a methyl-$d_3$ group, or a substituted or unsubstituted phenyl group. In the description, methyl-$d_3$ group may refer to *-$CD_3$.

Formula 1 may be represented by at least one of the compounds in Compound Group 1:

Compound Group 1
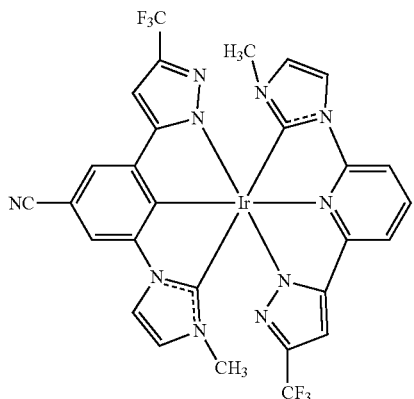
1
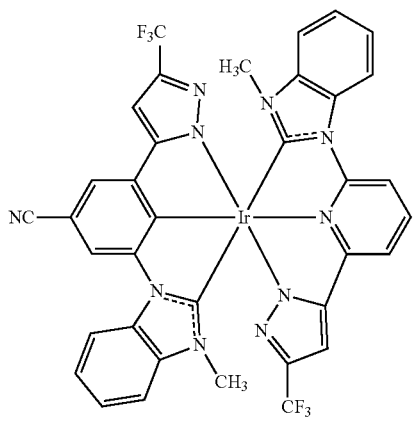
2
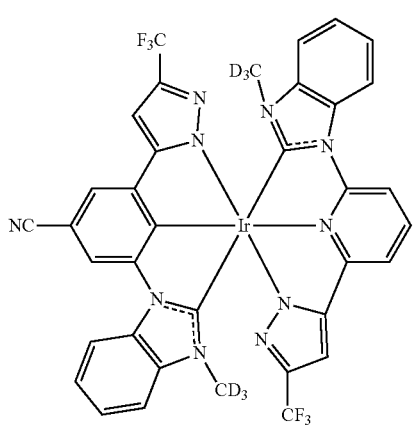
3
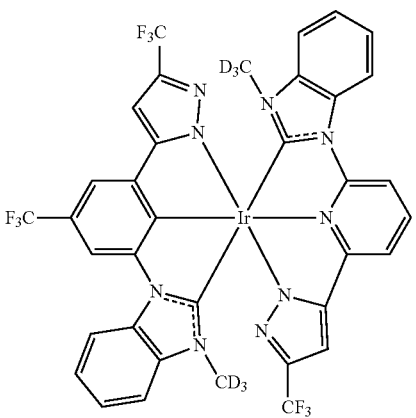
4
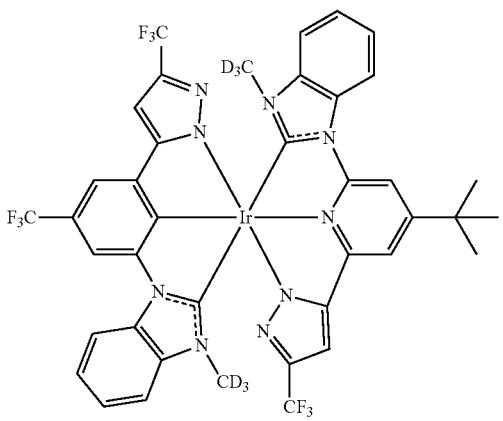
5
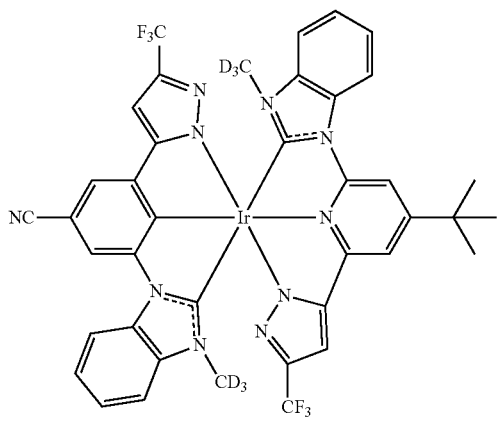
6

7
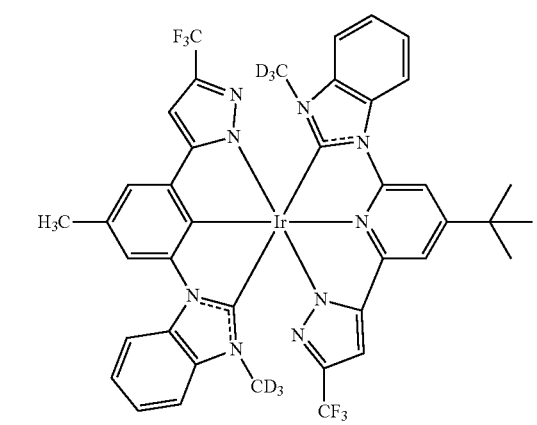
8
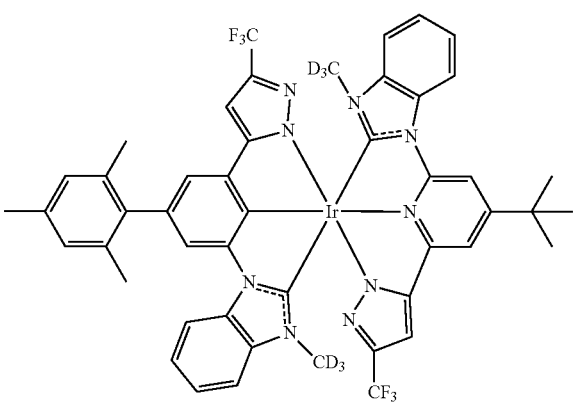
9
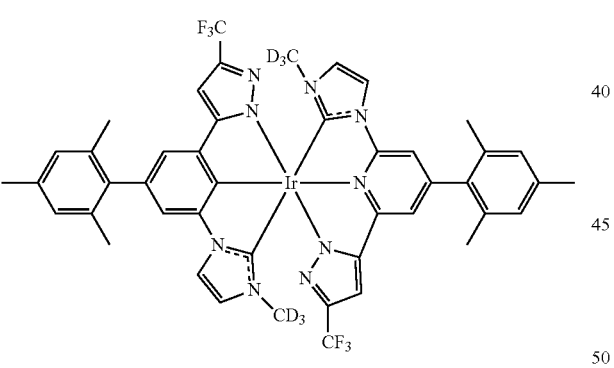
10
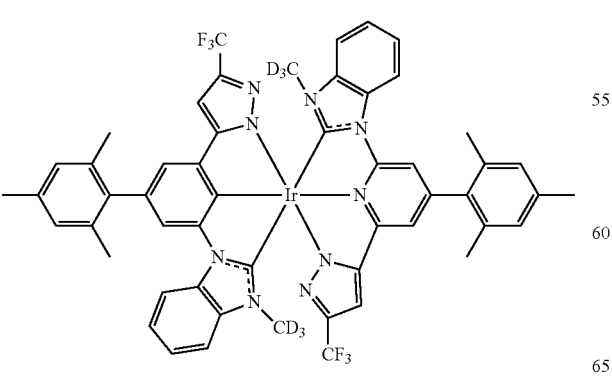
11
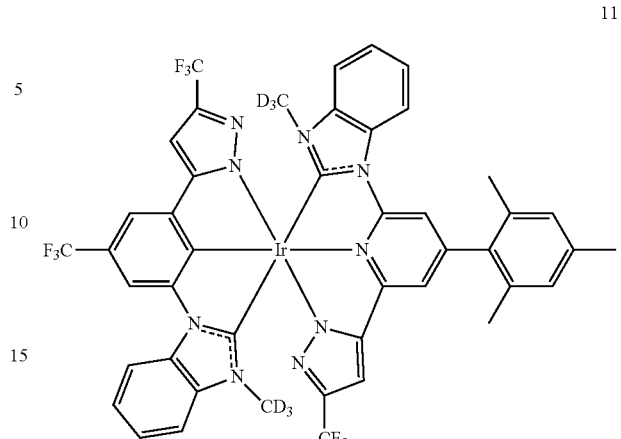
12
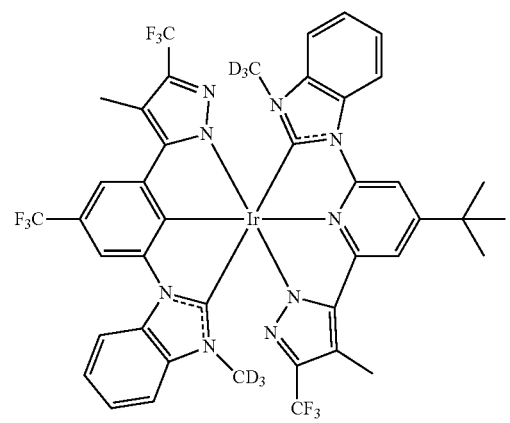
13
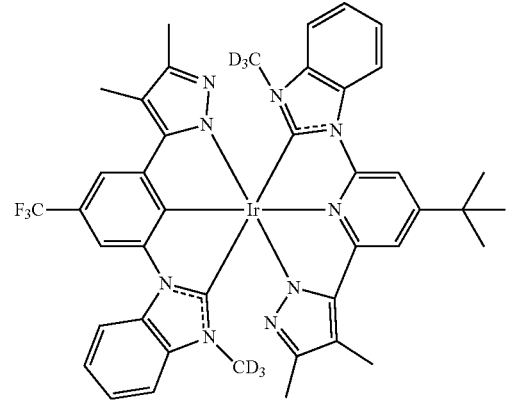

14

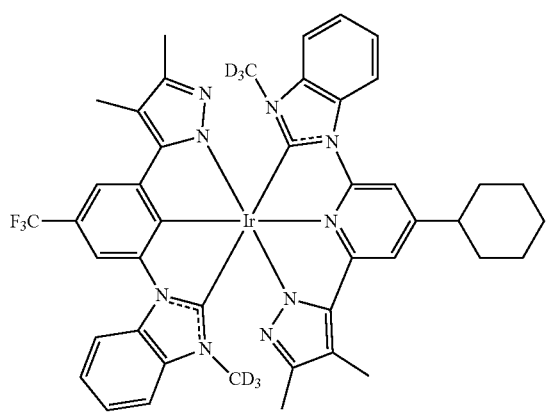

15

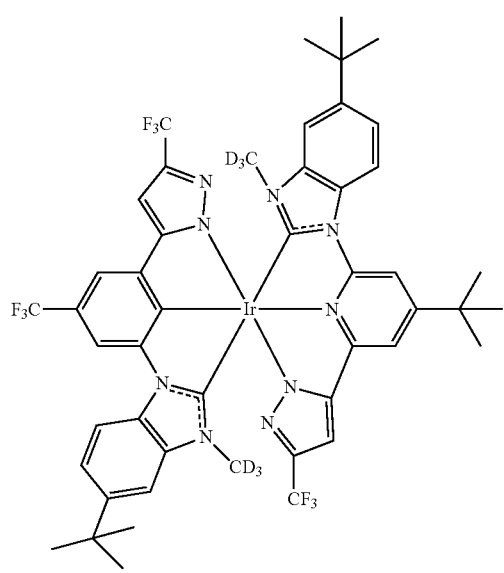

16

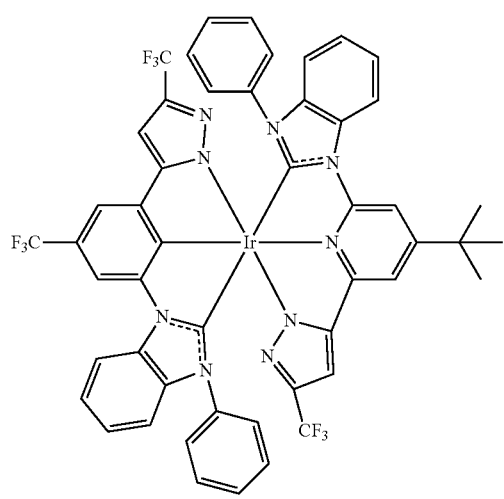

17

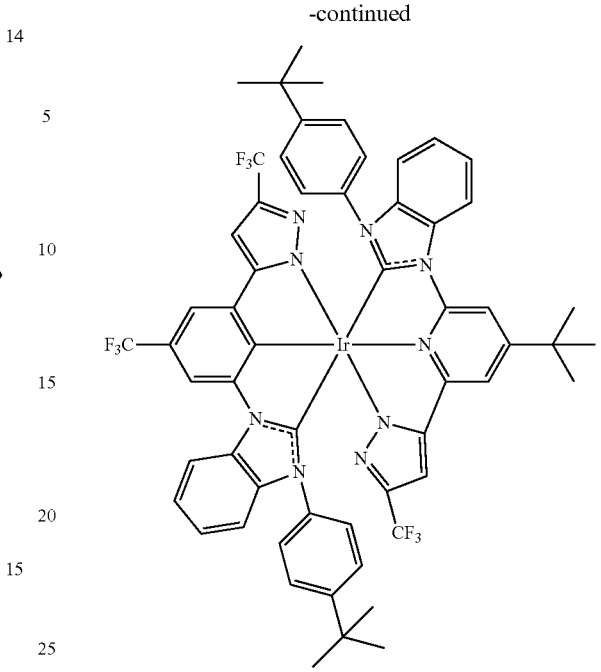

18

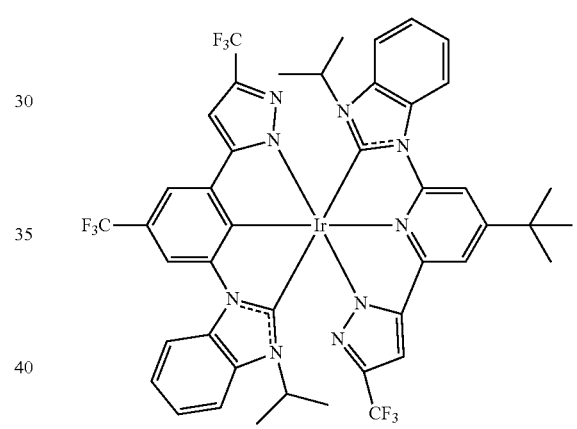

19

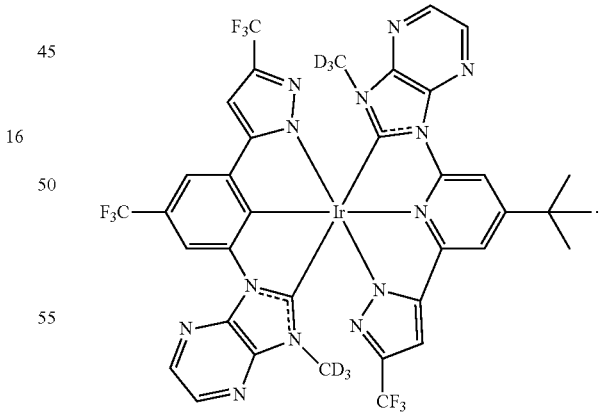

In the organic electroluminescence device 10 of an embodiment, the emission layer EML may include one or more of anthracene derivatives, pyrene derivatives, fluoranthene derivatives, chrysene derivatives, dihydrobenzanthracene derivatives, and/or triphenylene derivatives. For example, the emission layer EML may further include anthracene derivatives and/or pyrene derivatives.

In the organic electroluminescence devices 10 of embodiments as shown in FIG. 1 to FIG. 4, the emission layer EML may include a host and a dopant, and the emission layer EML may include the above-described organometallic compound of an embodiment as a dopant material.

The emission layer EML including the organometallic compound of an embodiment may emit blue light. The emission layer EML may emit blue light having a central wavelength of about 430 nm to about 490 nm. For example, the emission layer EML may emit deep blue light having a central wavelength of about 430 nm to about 455 nm, or a central wavelength of about 440 nm to about 455 nm.

The emission layer EML may further include any suitable host materials. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)triphenylamine, or 1,3,5-tris(1-phenyl-1H-benzo[d]imidazol-2-yl)benzene (TPBi). However, an embodiment of the present disclosure is not limited thereto. For example, tris(8-hydroxyquinolino)aluminum ($Alq_3$), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 9-(4-tert-butylphenyl)-3,6-bis(triphenylsilyl)-9H-carbazole (CzSi), etc., may be used as the host material.

In an embodiment, the emission layer EML may include, as the dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, and/or 1,4-bis(N,N-diphenylamino)pyrene)), etc.

In the organic electroluminescence devices 10 of embodiments as shown in FIGS. 1 to 4, the electron transport region ETR may be on the emission layer EML. The electron transport region ETR may include at least one of a hole blocking layer HBL, an electron transport layer ETL, or an electron injection layer EIL. However, an embodiment of the present disclosure is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure formed using a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. An embodiment of the present disclosure is not limited thereto, but the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), 1,3-bis[3,5-di(pyridine-3-yl)phenyl]benzene (BmPyPhB), or a mixture thereof. The thickness of the electron transport layer ETL may be from about 100 Å to about 1,000 Å, and may be, for example, from about 150 Å to about 500 Å. When the thickness of the electron transport layer ETL satisfies the above-described range, satisfactory (or suitable) electron transport properties may be obtained without substantial increase of a driving voltage.

When the electron transport region ETR includes the electron injection layer EIL, the electron transport region ETR may include a metal halide (such as LiF, NaCl, CsF, RbCl, RbI, and/or CuI), a metal in lanthanides (such as Yb), a metal oxide (such as $Li_2O$ and/or BaO), and/or lithium quinolate (LiQ). However, an embodiment of the present disclosure is not limited thereto. The electron injection layer EIL may also be formed using a mixture material of an electron transport material and an insulating organo metal salt. The organo metal salt may be a material having an energy band gap of about 4 eV or more. For example, the organo metal salt may include one or more of metal acetates, metal benzoates, metal acetoacetates, metal acetylacetonates, and/or metal stearates. The thickness of the electron injection layer EIL may be from about 1 Å to about 100 Å, and for example, from about 3 Å to about 90 Å. When the thickness of the electron injection layer EIL satisfies the above described range, satisfactory (or suitable) electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, an embodiment of the present disclosure is not limited thereto.

The second electrode EL2 may be on the electron transport region ETR. The second electrode EL2 may be a common electrode and/or a cathode. The second electrode EL2 may be a transmissive electrode, a transflective electrode or a reflective electrode. If the second electrode EL2 is the transmissive electrode, the second electrode EL2 may be formed using a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the second electrode EL2 may have a multi-layered structure including a reflective layer or a transfective layer formed using any of the above-described materials, and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

Meanwhile, on the second electrode EL2 of the organic electroluminescence device 10 of an embodiment, a capping layer (CPL) may be further provided. The capping layer CPL may include, for example, α-NPD, NPB, TPD, m-MT-DATA, Alq₃, CuPc, N4,N4,N4',N4'-tetra(biphenyl-4-yl)biphenyl-4,4'-diamine (TPD15), 4,4',4"-tris(carbazol-9-yl)triphenylamine (TCTA), N,N'-bis(naphthalen-1-yl), etc.

The above-described compound (e.g., organometallic compound) of an embodiment may be included in a functional layer other than the hole transport region HTR as a material for the organic electroluminescence device 10. The organic electroluminescence device 10 according to an embodiment of the present disclosure may include the above-described compound (e.g., the organometallic compound of the present embodiments) in at least one functional layer between the first electrode EL1 and the second electrode EL2, or in the capping layer (CPL) disposed on the second electrode EL2.

In the organic electroluminescence device 10, according to the application of voltages to the first electrode EL1 and second electrode EL2, respectively, holes injected from the first electrode EL1 move via the hole transport region HTR to the emission layer EML, and electrons injected from the second electrode EL2 move through the electron transport region ETR to the emission layer EML. Electrons and holes are recombined in the emission layer EML to produce excitons, and the excitons emit light via the transition from an excited state to a ground state.

Hereinafter, the compound (e.g., the organometallic compound) according to an embodiment and the organic electroluminescence device including the compound (e.g., the organometallic compound) of an embodiment of the present disclosure will be particularly explained referring to Examples and Comparative Examples. However, the following examples are only illustrations to assist the understanding of the present disclosure, and the scope of the present disclosure is not limited thereto.

1. Synthetic Example 1-1. Synthesis of Compound 1

The organometallic compound according to an embodiment of the present disclosure may be synthesized, for example, by the following Reaction 1:

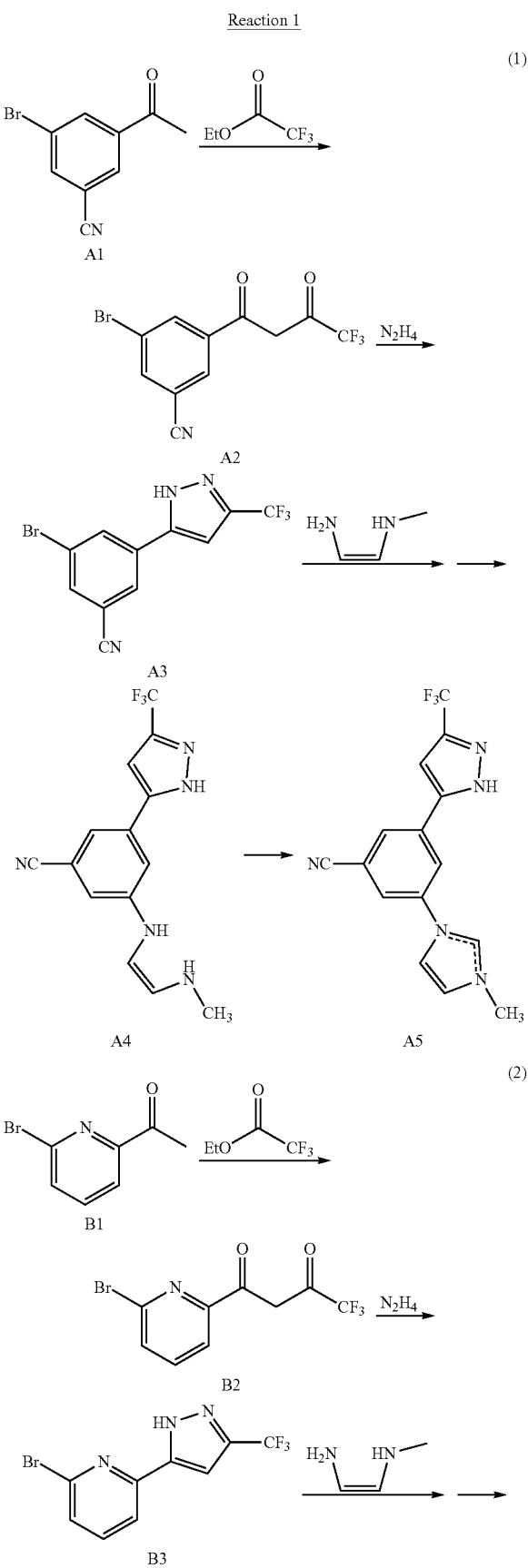

-continued

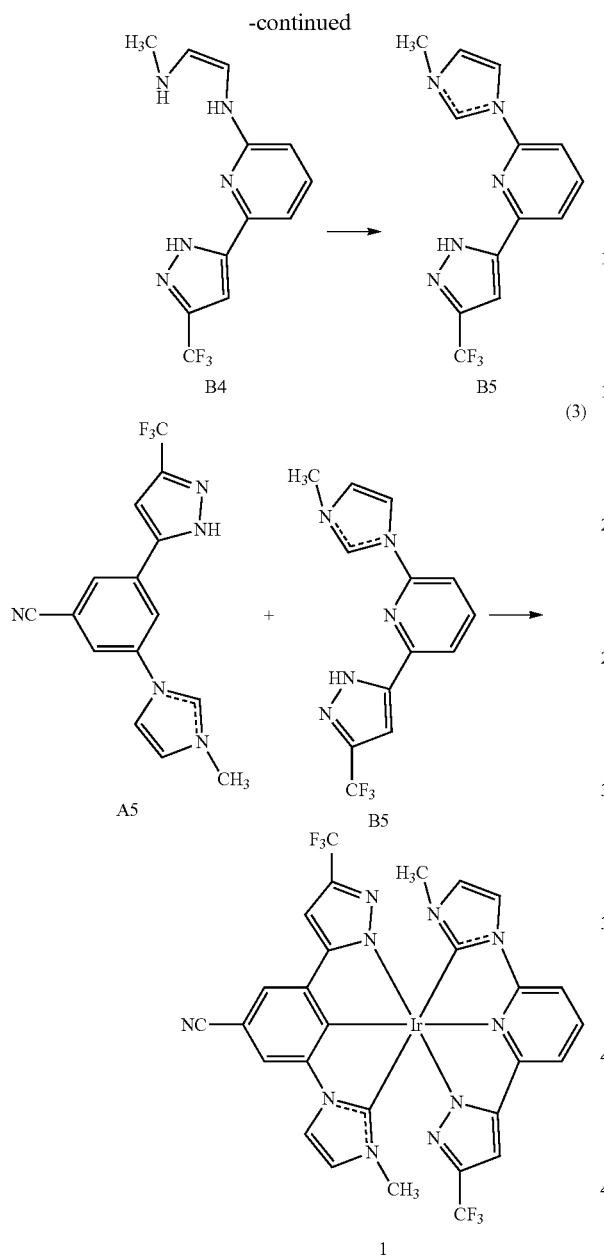

(1) Synthesis of Intermediate A2

Reactant A1 (1 eq), NaOEt (2 eq), and CF₃CO₂Et (1.2 eq) were dissolved in THF and then stirred at about 80° C. for about 12 hours. The reaction mixture was extracted with dichloromethane and distilled water. An organic layer was washed with distilled water three times, dried with magnesium sulfate and filtered. The filtrate was concentrated under a reduced pressure. The concentrate was separated by column chromatography to obtain Intermediate A2 in 70% yield.

(2) Synthesis of Intermediate A3

Intermediate A2 was dissolved in EtOH, and N₂H₄ was added thereto, followed by stirring at about 80° C. for about 12 hours. The reaction mixture was extracted with dichloromethane and distilled water. An organic layer was washed with distilled water three times, dried with magnesium sulfate and filtered. The filtrate was concentrated under a reduced pressure. The concentrate was separated by column chromatography to obtain Intermediate A3 in 70% yield.

(3) Synthesis of Intermediate A4

Intermediate A3, (Z)-N1-methylethene-1,2-diamine (1 eq), PdCl₂ (dppf) (0.1 eq) and NaOt-Bu (1.5 eq) were suspended in 100 mL of a dioxane solvent, the temperature was elevated to about 100° C., and the resultant solution was stirred for about 12 hours. The reaction mixture was extracted with methylene chloride and distilled water. An organic layer was washed with distilled water three times, dried with magnesium sulfate and filtered. The filtrate was concentrated under a reduced pressure. The concentrate was separated by column chromatography to obtain Intermediate A4 in 80% yield.

(4) Synthesis of Intermediate A5

Intermediate A4 was dissolved in triethyl orthoformate (50 eq), and HCl (1.2 eq) was added thereto, followed by stirring at about 80° C. for about 12 hours. The reaction mixture was extracted with dichloromethane and distilled water. An organic layer was washed with distilled water three times, dried with magnesium sulfate and filtered. The filtrate was concentrated under a reduced pressure. The concentrate was separated by column chromatography to obtain Intermediate A5 in 80% yield.

(5) Synthesis of Intermediate B2

Intermediate B2 was obtained using substantially the same method as in the synthetic example of Intermediate A2 except for using Reactant B1 instead of Reactant A1.

(6) Synthesis of Intermediate B3

Intermediate B3 was obtained using substantially the same method as in the synthetic example of Intermediate A3 except for using Intermediate B2 instead of Intermediate A2.

(7) Synthesis of Intermediate B4

Intermediate B4 was obtained using substantially the same method as in the synthetic example of Intermediate A4 except for using Intermediate B3 instead of Intermediate A3.

(8) Synthesis of Intermediate B5

Intermediate B5 was obtained using substantially the same method as in the synthetic example of Intermediate A5 except for using Intermediate B4 instead of Intermediate A4.

(9) Synthesis of Compound 1

Intermediate A5 (1 eq), Intermediate B5 (1 eq), IrCl₃·3H₂O (1 eq), and K₂CO₃ (20 eq) were dissolved in propionic acid (0.05 M), and then stirred at about 140° C. for about 12 hours. After finishing the reaction, the solvent was removed under a reduced pressure. The resultant product was extracted with methylene chloride and distilled water. An organic layer was washed with distilled water three times, dried with magnesium sulfate and filtered. The filtrate was concentrated under a reduced pressure. The concentrate was separated by column chromatography to obtain Compound 1 in 60% yield.

1-2. Synthesis of Compound 2

Compound 2 was obtained using substantially the same method as in Synthesis of Compound 1, except for using N1-methylbenzene-1,2-diamine instead of (Z)-N1-methylethene-1,2-diamine.

1-3. Synthesis of Compound 3

Compound 3 was obtained using substantially the same method as in Synthesis of Compound 1, except for using N1-(methyl-$d_3$)benzene-1,2-diamine instead of (Z)-N1-methylethene-1,2-diamine.

1-4. Synthesis of Compound 4

Compound 4 was obtained using substantially the same method as in Synthesis of Compound 1, except for using 1-(3-bromo-5-(trifluoromethyl)phenyl)ethan-1-one instead of Reactant A1 and using N1-(methyl-$d_3$)benzene-1,2-diamine instead of (Z)-N1-methylethene-1,2-diamine.

1-5. Synthesis of Compound 5

Compound 5 was obtained using substantially the same method as in Synthesis of Compound 1, except for using 1-(3-bromo-5-(trifluoromethyl)phenyl)ethan-1-one instead of Reactant A1, using 1-(6-bromo-4-(tert-butyl)pyridine-2-yl)ethan-1-one instead of Reactant B1, and using N1-(methyl-$d_3$)benzene-1,2-diamine instead of (Z)-N1-methylethene-1,2-diamine.

1-6. Synthesis of Compound 6

Compound 6 was obtained using substantially the same method as in Synthesis of Compound 1 except for using 1-(6-bromo-4-(tert-butyl)pyridine-2-yl)ethan-1-one instead of Reactant B1, and using N1-(methyl-$d_3$)benzene-1,2-diamine instead of (Z)-N1-methylethene-1,2-diamine.

1-7. Synthesis of Compound 7

Compound 7 was obtained using substantially the same method as in Synthesis of Compound 1, except for using 1-(3-bromo-5-methylphenyl)ethan-1-one instead of Reactant A1, using 1-(6-bromo-4-(tert-butyl)pyridin-2-yl)ethan-1-one instead of Reactant B1, and using N1-(methyl-$d_3$)benzene-1,2-diamine instead of (Z)-N1-methylethene-1,2-diamine.

1-8. Synthesis of Compound 8

Compound 8 was obtained using substantially the same method as in Synthesis of Compound 1, except for using 1-(5-bromo-2',4', 6'-trimethyl-[1,1'-biphenyl]-3-yl)ethan-1-one instead of Reactant A1, using 1-(6-bromo-4-(tert-butyl)pyridin-2-yl)ethan-1-one instead of Reactant B1, and using N1-(methyl-$d_3$)benzene-1,2-diamine instead of (Z)-N1-methylethene-1,2-diamine.

1-9. Synthesis of Compound 9

Compound 9 was obtained using substantially the same method as in Synthesis of Compound 1, except for using 1-(5-bromo-2',4', 6'-trimethyl-[1,1'-biphenyl]-3-yl)ethan-1-one instead of Reactant A1 and using 1-(6-bromo-4-mesitylpyridin-2-yl)ethan-1-one instead of Reactant B1.

1-10. Synthesis of Compound 10

Compound 10 was obtained using substantially the same method as in Synthesis of Compound 1, except for using 1-(5-bromo-2',4', 6'-trimethyl-[1,1'-biphenyl]-3-yl)ethan-1-one instead of Reactant A1, using 1-(6-bromo-4-mesitylpyridin-2-yl)ethan-1-one instead of Reactant B1, and using N1-(methyl-$d_3$)benzene-1,2-diamine instead of (Z)-N1-methylethene-1,2-diamine.

1-11. Synthesis of Compound 11

Compound 11 was obtained using substantially the same method as in Synthesis of Compound 1, except for using 1-(3-bromo-5-methylphenyl)ethan-1-one instead of Reactant A1, using 1-(6-bromo-4-mesitylpyridin-2-yl)ethan-1-one instead of Reactant B1, and using N1-(methyl-$d_3$)benzene-1,2-diamine instead of (Z)-N1-methylethene-1,2-diamine.

1-12. Synthesis of Compound 12

Compound 12 was obtained using substantially the same method as in Synthesis of Compound 1, except for using 1-(3-bromo-5-methylphenyl)ethan-1-one instead of Reactant A1, using 1-(6-bromo-4-(tert-butyl)pyridin-2-yl)ethan-1-one instead of Reactant B1, and using N1-(methyl-$d_3$)benzene-1,2-diamine instead of (Z)-N1-methylethene-1,2-diamine.

1-13. Synthesis of Compound 13

Compound 13 was obtained using substantially the same method as in Synthesis of Compound 1, except for using 3-bromo-5-propionylbenzonitrile instead of Reactant A1, using 1-(6-bromopyridin-2-yl)propan-1-one instead of Reactant B1, using ethyl acetate instead of $CF_3CO_2Et$, and using N1-(methyl-$d_3$)benzene-1,2-diamine instead of (Z)-N1-methylethene-1,2-diamine.

1-14. Synthesis of Compound 14

Compound 14 was obtained using substantially the same method as in Synthesis of Compound 1, except for using 3-bromo-5-propionylbenzonitrile instead of Reactant A1, using 1-(6-bromo-4-cyclohexylpyridin-2-yl)ethan-1-one instead of Reactant B1, using ethyl acetate instead of $CF_3CO_2Et$, and using N1-(methyl-$d_3$)benzene-1,2-diamine instead of (Z)-N1-methylethene-1,2-diamine.

1-15. Synthesis of Compound 15

Compound 15 was obtained using substantially the same method as in Synthesis of Compound 1, except for using 1-(3-bromo-5-(trifluoromethyl)phenyl)ethan-1-one instead of Reactant A1, using 1-(6-bromo-4-(tert-butyl)pyridin-2-yl)ethan-1-one instead of Reactant B1, and using 5-(tert-butyl)-N1-methylbenzene-1,2-diamine instead of (Z)-N1-methylethene-1,2-diamine.

1-16. Synthesis of Compound 16

Compound 16 was obtained using substantially the same method as in Synthesis of Compound 1, except for using 1-(3-bromo-5-(trifluoromethyl)phenyl)ethan-1-one instead of Reactant A1, using 1-(6-bromo-4-(tert-butyl)pyridin-2-yl)ethan-1-one instead of Reactant B1, using N1-methylbenzene-1,2-diamine instead of (Z)-N1-methylethene-1,2-diamine, and using phenyl bromide instead of CH$_3$Br.

1-17. Synthesis of Compound 17

Compound 17 was obtained using substantially the same method as in Synthesis of Compound 1, except for using 1-(3-bromo-5-(trifluoromethyl)phenyl)ethan-1-one instead of Reactant A1, using 1-(6-bromo-4-(tert-butyl)pyridin-2-yl)ethan-1-one instead of Reactant B1, using N1-methylbenzene-1,2-diamine instead of (Z)-N1-methylethene-1,2-diamine, and using 1-bromo-4-(tert-butyl)benzene instead of CH$_3$Br.

1-18. Synthesis of Compound 18

Compound 18 was obtained using substantially the same method as in Synthesis of Compound 1, except for using 1-(3-bromo-5-(trifluoromethyl)phenyl)ethan-1-one instead of Reactant A1, using 1-(6-bromo-4-(tert-butyl)pyridin-2-yl)ethan-1-one instead of Reactant B1, using N1-methylbenzene-1,2-diamine instead of (Z)-N1-methylethene-1,2-diamine, and using isopropyl bromide instead of CH$_3$Br.

1-19. Synthesis of Compound 19

Compound 19 was obtained using substantially the same method as in Synthesis of Compound 1, except for using 1-(3-bromo-5-(trifluoromethyl)phenyl)ethan-1-one instead of Reactant A1, using 1-(6-bromo-4-(tert-butyl)pyridin-2-yl)ethan-1-one instead of Reactant B1, and using N2-methylpyrazine-2,3-diamine instead of (Z)-N1-methylethene-1,2-diamine.

$^1$H NMR values of Compounds 1, 5, 8, 15, 17 and 19 were measured to identify (or confirm) the structure of the compounds synthesized. The $^1$H NMR values of Compounds 1, 5, 8, 15, 17 and 19 are shown in Table 1 below.

TABLE 1

| Compound | $^1$H NMR (CDCl$_3$, 400 MHz) | MS/FAB Found | MS/FAB Calc. |
|---|---|---|---|
| 1 | 8.65 (d, 2H), 7.58-7.67 (m, 2H), 7.38 (s, 1H), 7.15 (s, 1H), 7.11 (s, 1H), 6.49 (s, 1H), 6.48 (s, 1H), 6.30 (s, 1H), 6.02 (s, 1H), 3.67 (s, 3H), 3.66 (s, 3H) | 799.7214 | 800.1170 |
| 5 | 7.75 (s, 1H), 7.66 (s, 1H), 7.40-7.45 (s, 4H), 7.24 (s, 1H), 7.08 (d, 2H), 6.68-6.71 (m, 2H), 6.62 (s, 1H), 6.30 (s, 1H), 6.02 (s, 1H), 1.32 (1H, 9H) | 1004.9742 | 1005.2408 |
| 8 | 7.67 (s, 1H), 7.40-7.45 (m, 4H), 7.37 (s, 1H), 7.24 (s, 1H), 7.08 (d, 2H), 7.01 (s, 2H), 6.68-7.72 (m, 2H), 6.62 (s, 1H), 6.30 (s, 1H), 6.02 (s, 1H), 2.92 (s, 6H), 2.48 (s, 3H), 1.32 (s, 9H) | 1055.1150 | 1055.3317 |
| 15 | 7.75 (s, 1H), 7.66 (s, 1H), 7.24 (s, 1H), 7.00 (d, 2H), 6.85 (s, 2H), 6.62 (s, 1H), 6.52 (d, 2H), 6.30 (s, 1H), 6.02 (s, 1H), 1.32 (s, 9H), 1.25 (s, 18 H) | 1117.1902 | 1117.3660 |

TABLE 1-continued

| Compound | $^1$H NMR (CDCl$_3$, 400 MHz) | MS/FAB Found | MS/FAB Calc. |
|---|---|---|---|
| 17 | 7.75 (s, 1H), 7.66 (s, 1H), 7.24 (s, 1H), 7.00-7.15 (m, 12H), 6.90-6.95 (m, 4H), 6.62 (s, 1H), 6.30 (s, 1H), 6.02 (s, 1H), 1.33 (s, 18H), 1.32 (s, 9H) | 1235.2956 | 1235.3596 |
| 19 | 7.75 (s, 1H), 7.66 (s, 1H), 7.45-7.48 (m, 4H), 7.24 (s, 1H), 6.62 (s, 1H), 6.30 (s, 1H), 6.02 (s, 1H), 1.32 (s, 9H) | 1008.9262 | 1009.2218 |

2. Evaluation of the Properties of Organometallic Compound (Example Compounds)

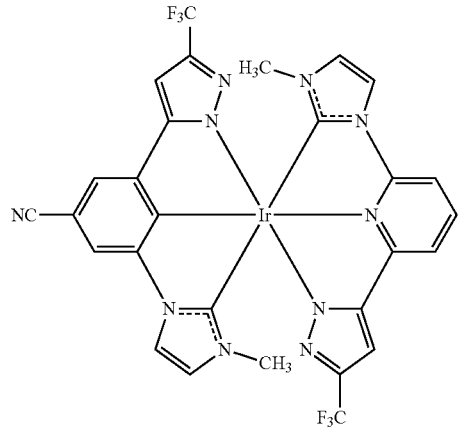

1

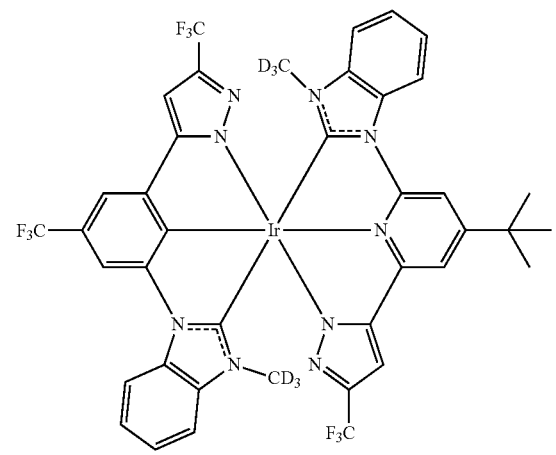

5

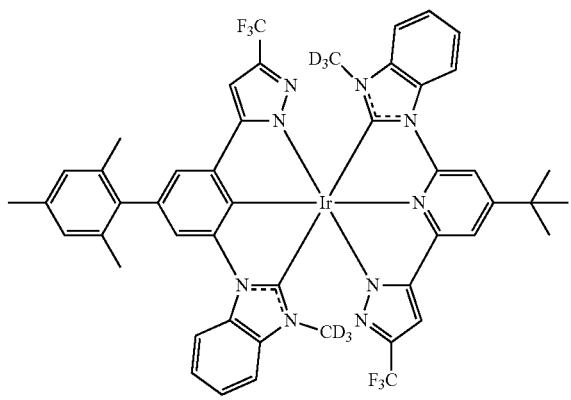
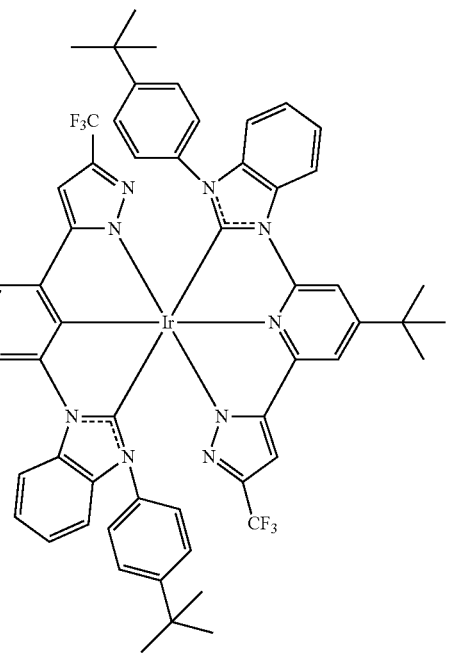
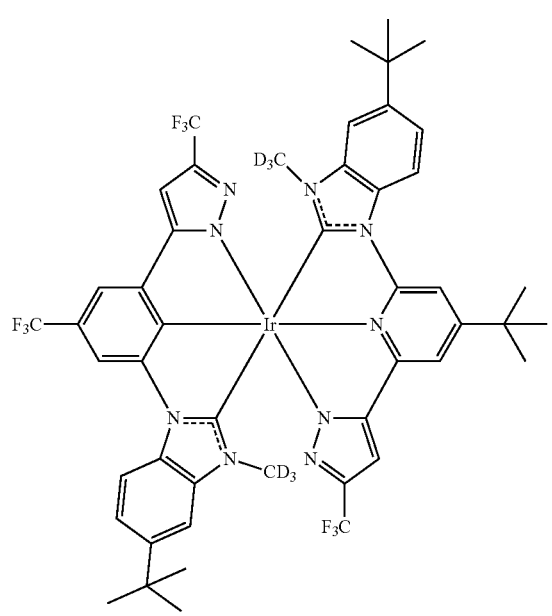
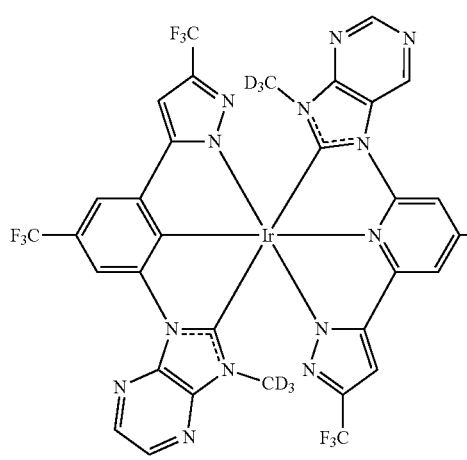

(Comparative Compound)

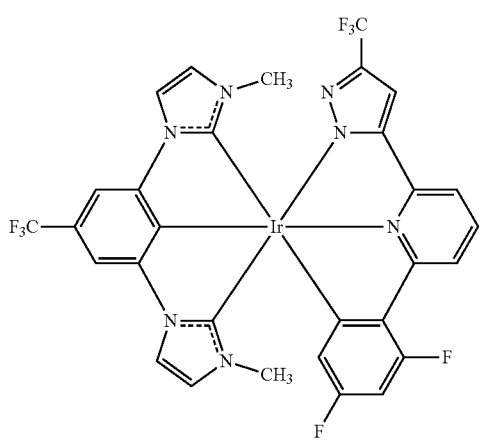

C1

The $^3$MLCT energy level value, the $^3$MC energy level value, and $\lambda_{max}^{sim}$ (simulation measurement value of maximum light-emitting wavelength) of Example Compounds 1, 5, 8, 15, 17 and 19 and Comparative Compound C1 were measured by a nonempirical molecular orbital method. Particularly, calculation was performed using Gaussian09, which is a product of Gaussian Co., and using B3LYP as a functional, and 6-31G(d) as a basis function. In addition, $\lambda_{max}^{exp}$ (experimental value of maximum light-emitting wavelength) was measured using C9920-11 brightness characteristics measurement system of Hamamatsu Photonics. Measured values are shown in Table 2 below.

TABLE 2

| Compound | $^3$MLCT (eV) | $^3$MC (eV) | Δ($^3$MLCT − $^3$MC) | $\lambda_{max}^{sim}$ (nm) | $\lambda_{max}^{exp}$ (nm) | Band gap energy |
|---|---|---|---|---|---|---|
| Example Compound 1 | 15.0 | 0.95 | 14.05 | 453.50 | 451 | 3.30 |
| Example Compound 5 | 15.5 | 0.98 | 14.52 | 452.36 | 450 | 3.50 |
| Example Compound 8 | 14.8 | 0.88 | 13.92 | 470.02 | 468 | 3.10 |
| Example Compound 15 | 14.5 | 0.88 | 13.62 | 468.23 | 466 | 3.00 |
| Example Compound 17 | 14.0 | 0.90 | 13.10 | 468.00 | 466 | 3.09 |
| Example Compound 19 | 13.8 | 0.87 | 12.93 | 475.65 | 473 | 2.99 |
| Comparative Compound C1 | 11.34 | 0.87 | 10.47 | 452 | 465.39 | 3.03 |

Referring to Table 2, it was confirmed that the Δ($^3$MLCT-$^3$MC) values of the Example Compounds were higher than that of Comparative Compound C1. It is believed that the Example Compounds have high Δ($^3$MLCT-$^3$MC) values, because both ligands have asymmetric structures. If the difference value between the energy level of the triplet metal centered state ($^3$MC) and the energy level of the triplet metal-to-ligand charge transfer state ($^3$MLCT) of the organometallic compound is small, the bond between the ligand and the metal atom of the organometallic compound may be cleaved to easily deteriorate a light-emitting material. However, the organometallic compound of an embodiment has a high Δ($^3$MLCT-$^3$MC) value of about 12 eV or more. Accordingly, the life of the light-emitting material may increase, and the increase of the life of a device may be achieved.

It was found that the Example Compounds attained longer life than Comparative Compound C1 and could still emit blue light in a similar range. In addition, Example Compound 1 and Example Compound 5 were found to emit deeper blue than the Comparative Compound and achieve long life. That is, the organometallic compound of an embodiment may emit blue light in various ranges, and may include a material emitting deep blue light having a wavelength of about 455 nm or less.

The organometallic compound of an embodiment includes an iridium atom, and a first ligand and a second ligand, which are combined with the iridium atom. The first ligand includes a substituted or unsubstituted phenyl ligand, a substituted or unsubstituted pyrazole ligand combined with the phenyl ligand, and a substituted or unsubstituted five-member ring N-heterocyclic carbene ligand combined with the phenyl ligand. The second ligand includes a substituted or unsubstituted pyridine ligand, a substituted or unsubstituted pyrazole ligand combined with the pyridine ligand, and a substituted or unsubstituted five-member ring N-heterocyclic carbene ligand combined with the pyridine ligand. The organometallic compound of an embodiment may be applied to an organic electroluminescence device and may achieve long life of the device and deep blue light emission.

The organic electroluminescence device according to an embodiment of the present disclosure may achieve long life.

The organometallic compound according to an embodiment of the present disclosure is used in an organic electroluminescence device, and the long life of the organic electroluminescence device may be achieved.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present invention have been described, it is understood that the present invention should not be limited to these example embodiments, but that various changes and modifications can be made by one ordinary skilled in the art within the spirit and scope of the present invention as hereinafter claimed and equivalents thereof.

What is claimed is:

1. An organic electroluminescence device, comprising:
a first electrode;
an emission layer disposed on the first electrode; and
a second electrode disposed on the emission layer,
wherein the emission layer comprises an organometallic compound comprising an iridium atom, and a first ligand and a second ligand, which are combined with the iridium atom,
the first ligand comprises a substituted or unsubstituted phenyl ligand, and a substituted or unsubstituted pyrazole ligand combined with the phenyl ligand, and a substituted or unsubstituted five-member ring N-heterocyclic carbene ligand combined with the phenyl ligand, and
the second ligand comprises a substituted or unsubstituted pyridine ligand, and a substituted or unsubstituted pyrazole ligand combined with the pyridine ligand, and a substituted or unsubstituted five-member ring N-heterocyclic carbene ligand combined with the pyridine ligand.

2. The organic electroluminescence device of claim 1, wherein the substituted or unsubstituted five-member ring N-heterocyclic carbene ligand in each of the first ligand and the second ligand is a substituted or unsubstituted imidazole N-heterocyclic carbene derivative.

3. The organic electroluminescence device of claim 1, wherein the substituted or unsubstituted five-member ring N-heterocyclic carbene ligand in each of the first ligand and the second ligand is a substituted or unsubstituted imidazole-2-ylidene, a substituted or unsubstituted benzimidazol-2-ylidene, or a substituted or unsubstituted imidazo pyrazine-2-ylidene.

4. The organic electroluminescence device of claim 1, wherein the emission layer comprises a host and a dopant, and
the dopant comprises the organometallic compound.

5. The organic electroluminescence device of claim 1, wherein the emission layer is to emit blue light.

6. The organic electroluminescence device of claim 1, wherein a difference Δ($^3$MLCT-$^3$MC) between a $^3$MLCT energy level and a $^3$MC energy level of the organometallic compound is from about 12 eV to about 16 eV.

7. The organic electroluminescence device of claim 1, wherein the emission layer is configured to emit light having a central wavelength of about 430 nm to about 490 nm.

8. The organic electroluminescence device of claim 1, wherein the organometallic compound is represented by Formula 1:

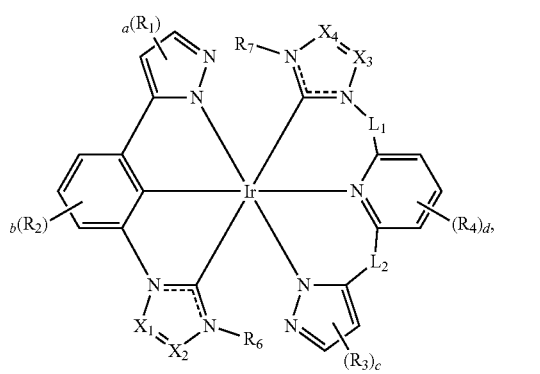

Formula 1 in Formula 1, $X_1$ to $X_4$ are each independently $CR_5$ or N, $R_1$ to $R_5$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring, $R_6$ and $R_7$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring, $L_1$ and $L_2$ are each independently a direct linkage, an oxygen atom, a sulfur atom, a substituted or unsubstituted divalent alkyl group of 1 to 20 carbon atoms, a substituted or unsubstituted divalent silyl group, a substituted or unsubstituted arylene group of 6 to 30 carbon atoms for forming a ring, or a substituted or unsubstituted heteroarylene group of 2 to 30 carbon atoms for forming a ring, "a" and "c" are each independently an integer of 0 to 2, and "b" and "d" are each independently an integer of 0 to 3.

9. The organic electroluminescence device of claim 8, wherein Formula 1 is represented by Formula 1-1:

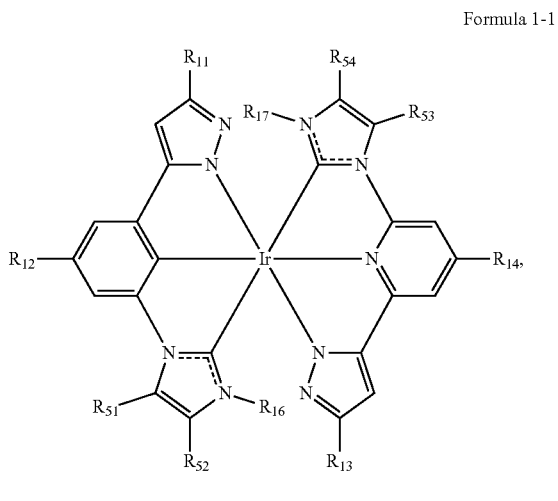

Formula 1-1

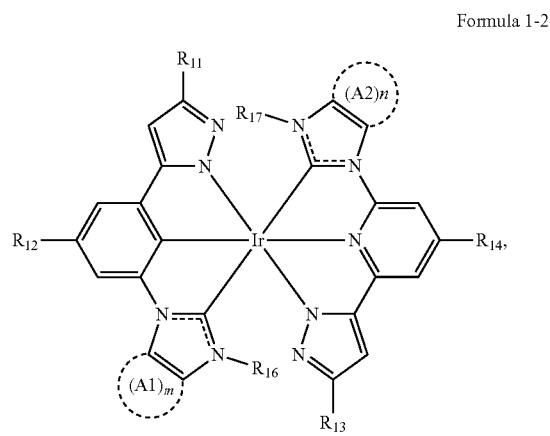

Formula 1-2 in Formula 1-1, $R_{11}$ to $R_{14}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{16}$ and $R_{17}$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and $R_{51}$ to $R_{54}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring.

10. The organic electroluminescence device of claim 8, wherein Formula 1 is represented by Formula 1-2:

in Formula 1-2,

A1 and A2 are each independently a substituted or unsubstituted aryl group of 6 to 30 carbon atoms for forming a ring, or a substituted or unsubstituted heteroaryl group of 2 to 30 carbon atoms for forming a ring, $R_{11}$ to $R_{14}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{16}$ and $R_{17}$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and "m" and "n" are each independently 0 or 1.

11. The organic electroluminescence device of claim 8, wherein $R_1$ to $R_4$ are each independently an unsubstituted methyl group, an unsubstituted ethyl group, an unsubstituted isopropyl group, an unsubstituted t-butyl group, a cyano group, a trifluoromethyl group, a methyl-$d_3$ group, an unsubstituted cyclohexyl group, or an alkyl-substituted phenyl group, and $R_6$ and $R_7$ are each independently an unsubstituted methyl group, an unsubstituted ethyl group, an unsubstituted isopropyl group, an unsubstituted t-butyl group, a methyl-$d_3$ group, a cyano group, or an alkyl-substituted phenyl group.

12. The organic electroluminescence device of claim 8, wherein the emission layer comprises at least one selected from compounds represented in Compound Group 1:

Compound Group 1
1
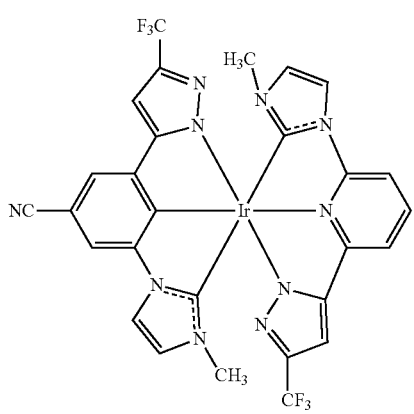
4
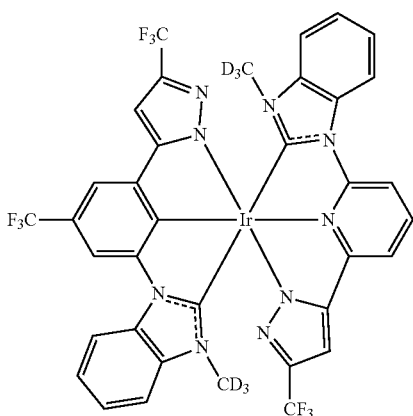
2
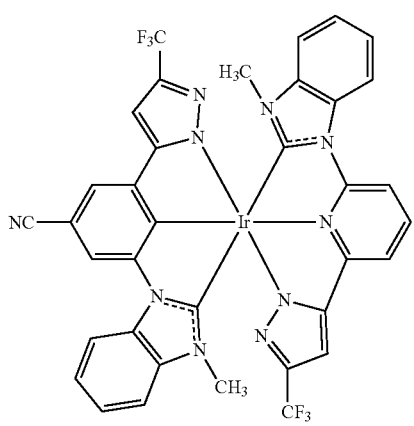
5
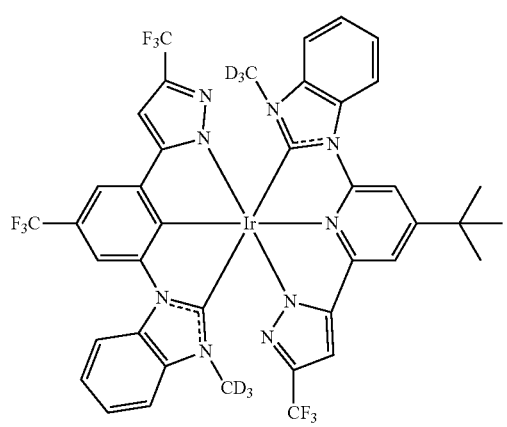
3
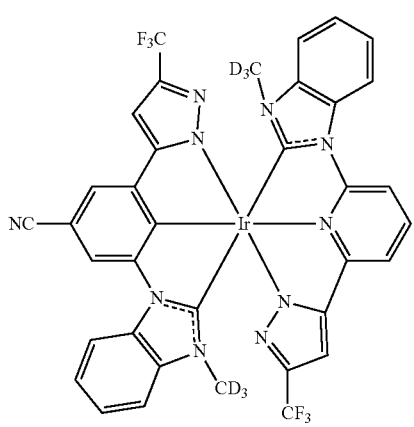
6
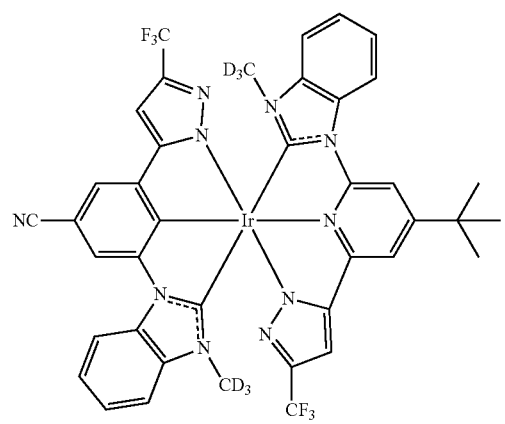

47
-continued
7
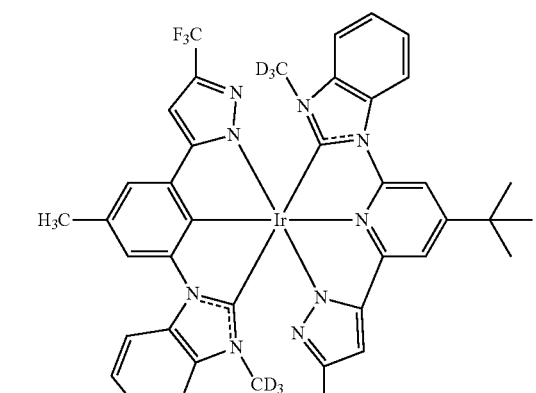
8
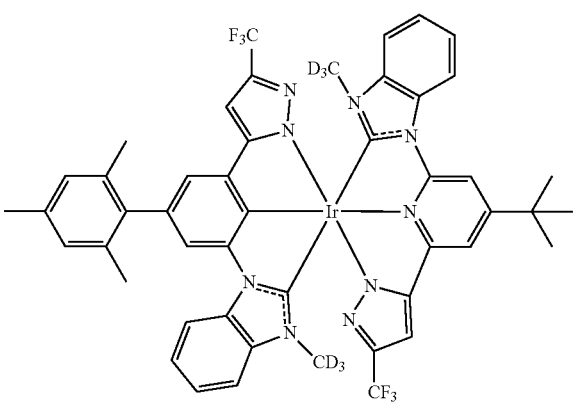
9
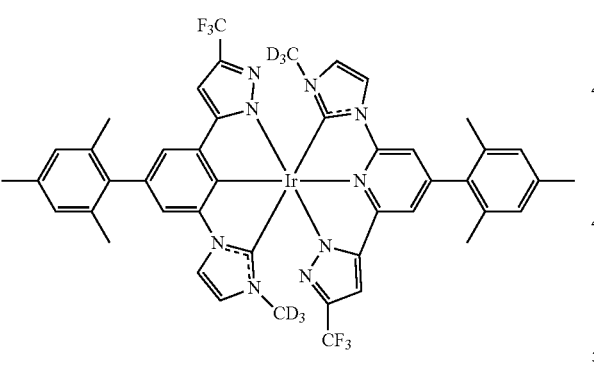
10
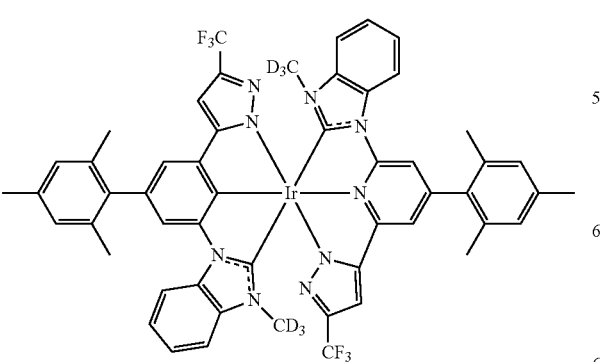
48
-continued
11
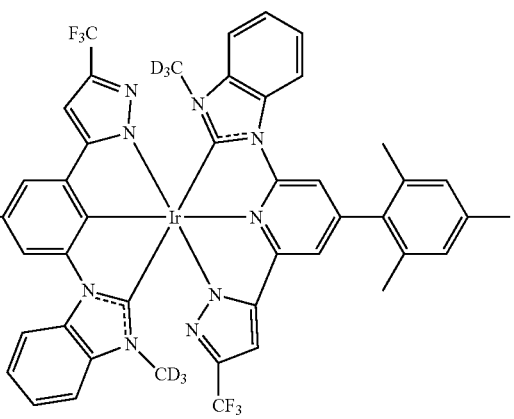
12
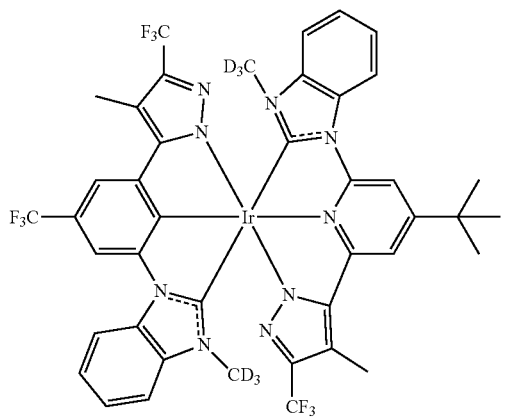
13
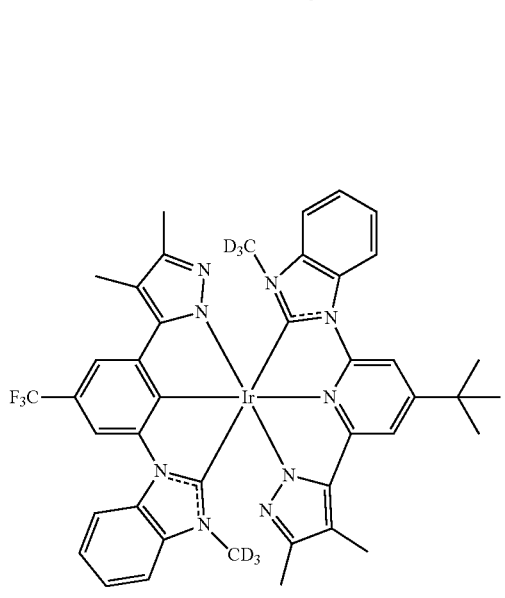

14
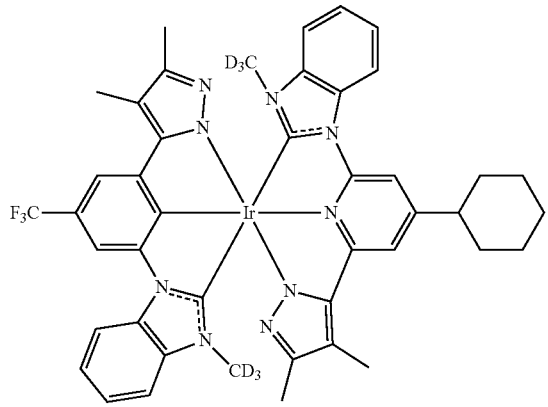
15
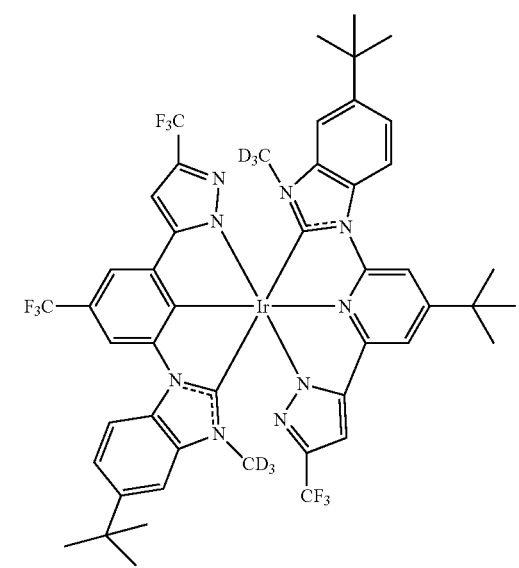
16
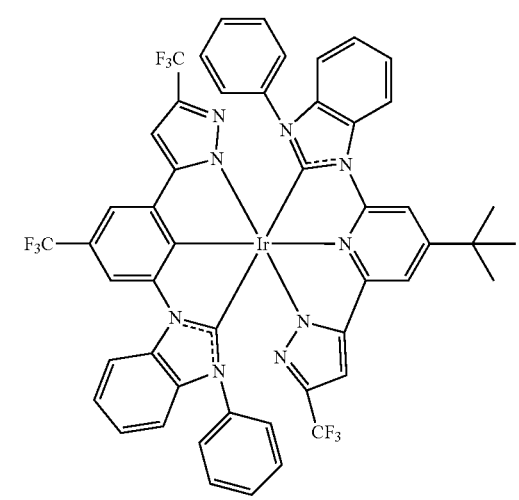
17
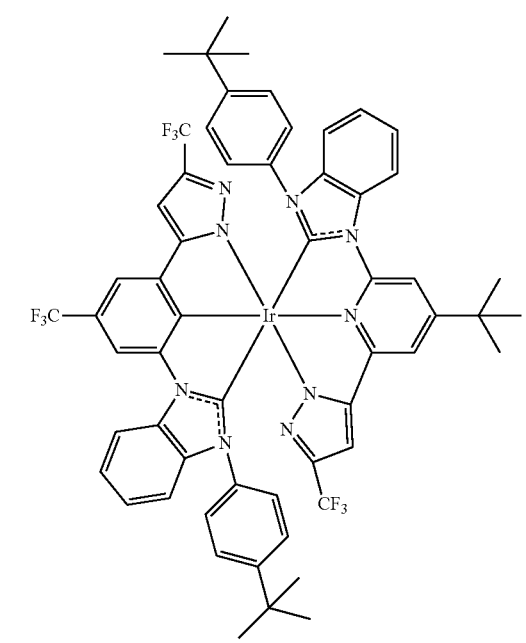
18
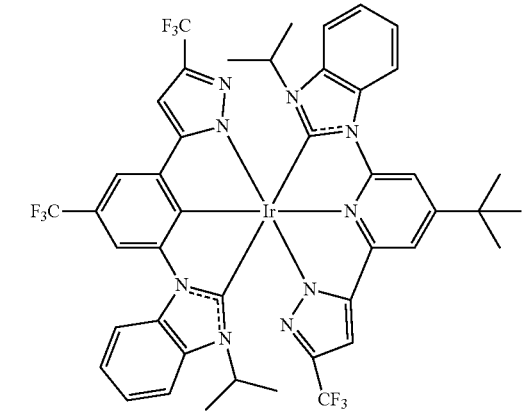
19
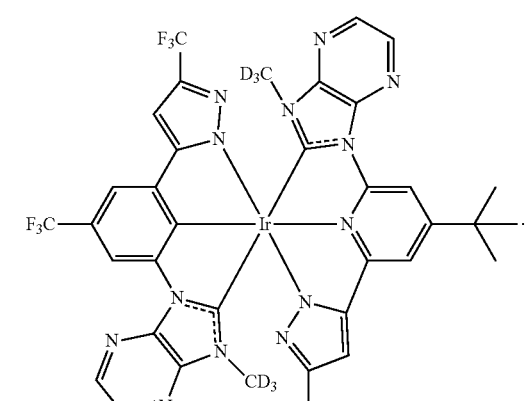
13. An organic electroluminescence device, comprising:
a first electrode;
a hole transport region disposed on the first electrode;
an emission layer disposed on the hole transport region;
an electron transport region disposed on the emission layer; and a second electrode disposed on the electron transport region, wherein the emission layer comprises an organometallic compound represented by Formula 1:

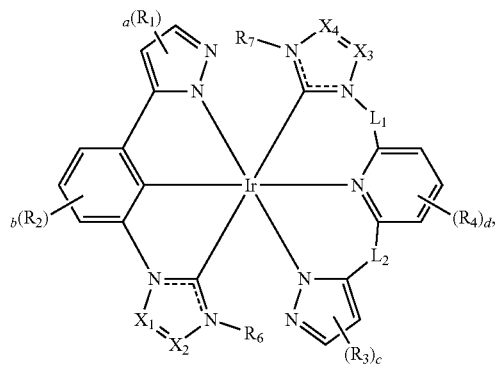

Formula 1 in Formula 1, $X_1$ to $X_4$ are each independently $CR_5$ or N, $R_1$ to $R_5$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring, $R_6$ and $R_7$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring, $L_1$ and $L_2$ are each independently a direct linkage, an oxygen atom, a sulfur atom, a substituted or unsubstituted divalent alkyl group of 1 to 20 carbon atoms, a substituted or unsubstituted divalent silyl group, a substituted or unsubstituted arylene group of 6 to 30 carbon atoms for forming a ring, or a substituted or unsubstituted heteroarylene group of 2 to 30 carbon atoms for forming a ring, "a" and "c" are each independently an integer of 0 to 2, and "b" and "d" are each independently an integer of 0 to 3.

14. The organic electroluminescence device of claim 13, wherein Formula 1 is represented by Formula 1-1:

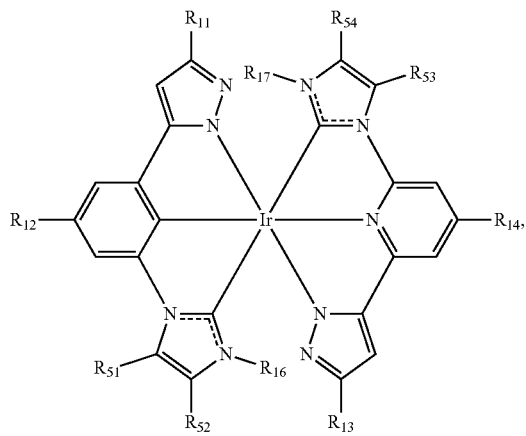

Formula 1-1 in Formula 1-1, $R_{11}$ to $R_{14}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{16}$ and $R_{17}$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and $R_{51}$ to $R_{54}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring.

15. The organic electroluminescence device of claim 13, wherein Formula 1 is represented by Formula 1-2:

Formula 1-2

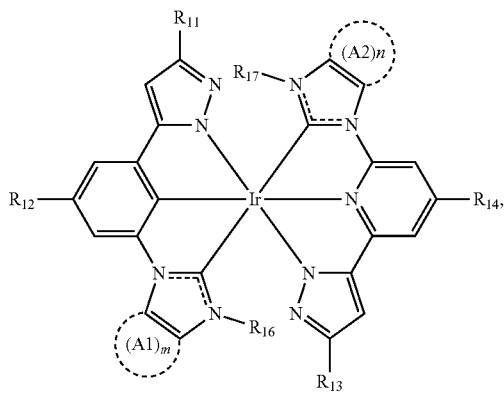

17. An organometallic compound represented by Formula 1:

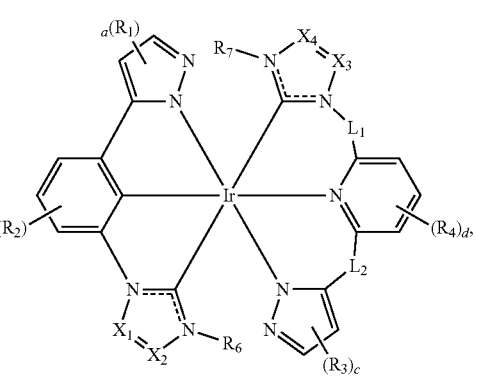

Formula 1 in Formula 1-2,

A1 and A2 are each independently a substituted or unsubstituted aryl group of 6 to 30 carbon atoms for forming a ring, or a substituted or unsubstituted heteroaryl group of 2 to 30 carbon atoms for forming a ring, $R_{11}$ to $R_{14}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{16}$ and $R_{17}$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and "m" and "n" are each independently 0 or 1.

16. The organic electroluminescence device of claim 13, wherein $R_1$ to $R_4$ are each independently an unsubstituted methyl group, an unsubstituted ethyl group, an unsubstituted isopropyl group, an unsubstituted t-butyl group, a cyano group, a trifluoromethyl group, a methyl-$d_3$ group, an unsubstituted cyclohexyl group, or an alkyl-substituted phenyl group, and $R_6$ and $R_7$ are each independently an unsubstituted methyl group, an unsubstituted ethyl group, an unsubstituted isopropyl group, an unsubstituted t-butyl group, a methyl-$d_3$ group, a cyano group, or an alkyl-substituted phenyl group.

in Formula 1, $X_1$ to $X_4$ are each independently $CR_5$ or N, $R_1$ to $R_5$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring, $R_6$ and $R_7$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring, $L_1$ and $L_2$ are each independently a direct linkage, an oxygen atom, a sulfur atom, a substituted or unsubstituted divalent alkyl group of 1 to 20 carbon atoms, a substituted or unsubstituted divalent silyl group, a substituted or unsubstituted arylene group of 6 to 30 carbon atoms for forming a ring, or a substituted or unsubstituted heteroarylene group of 2 to 30 carbon atoms for forming a ring, "a" and "c" are each independently an integer of 0 to 2, and "b" and "d" are each independently an integer of 0 to 3.

18. The organometallic compound of claim 17, wherein Formula 1 is represented by Formula 1-1:

Formula 1-1

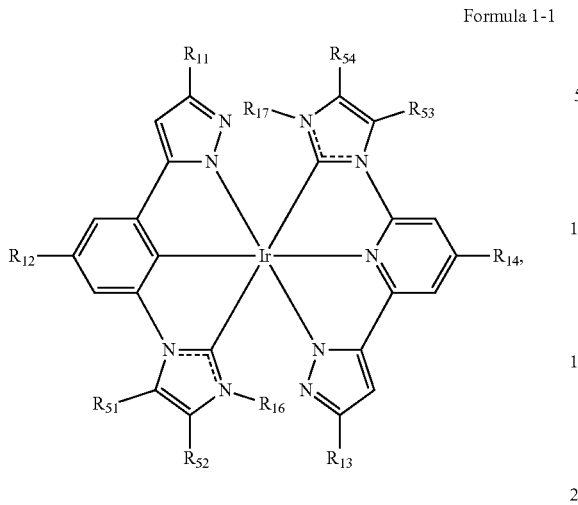

Formula 1-2

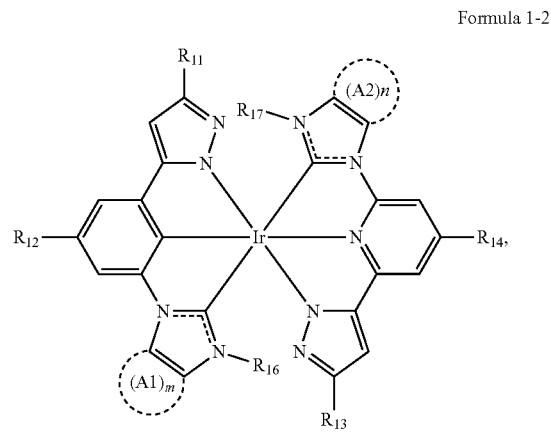

in Formula 1-1, $R_{11}$ to $R_{14}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{16}$ and $R_{17}$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and $R_{51}$ to $R_{54}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or combined with an adjacent group to form a ring.

19. The organometallic compound of claim 17, wherein Formula 1 is represented by Formula 1-2:

in Formula 1-2,

A1 and A2 are each independently a substituted or unsubstituted aryl group of 6 to 30 carbon atoms for forming a ring, or a substituted or unsubstituted heteroaryl group of 2 to 30 carbon atoms for forming a ring, $R_{11}$ to $R_{14}$ are each independently a hydrogen atom, a deuterium atom, a halogen atom, a cyano group, a substituted or unsubstituted thio group, a substituted or unsubstituted oxy group, a substituted or unsubstituted silyl group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{16}$ and $R_{17}$ are each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and "m" and "n" are each independently 0 or 1.

20. The organometallic compound of claim 17, wherein $R_1$ to $R_4$ are each independently an unsubstituted methyl group, an unsubstituted ethyl group, an unsubstituted isopropyl group, an unsubstituted t-butyl group, a cyano group, a trifluoromethyl group, a methyl-$d_3$ group, an unsubstituted cyclohexyl group, or an alkyl-substituted phenyl group, and $R_6$ and $R_7$ are each independently an unsubstituted methyl group, an unsubstituted ethyl group, an unsubstituted isopropyl group, an unsubstituted t-butyl group, a methyl-$d_3$ group, a cyano group, or an alkyl-substituted phenyl group.

21. The organometallic compound of claim 17, wherein Formula 1 is at least one selected from compounds represented in Compound Group 1:

Compound Group 1
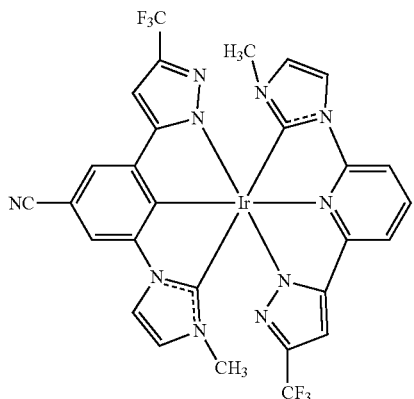
1
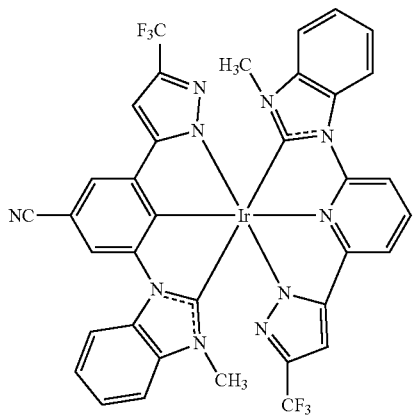
2
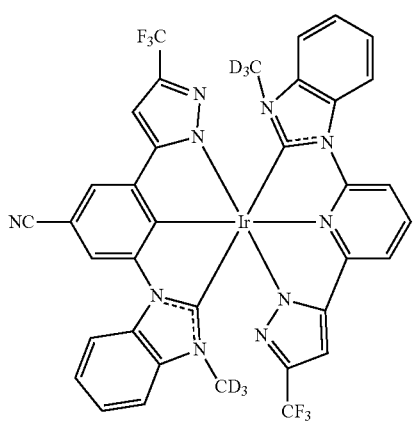
3
-continued
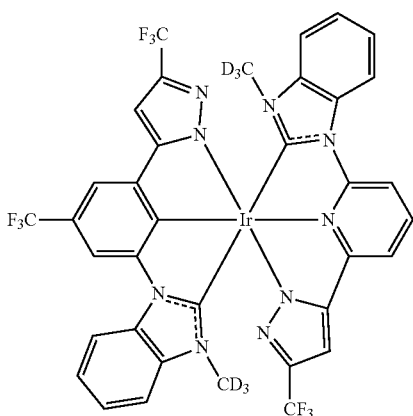
4
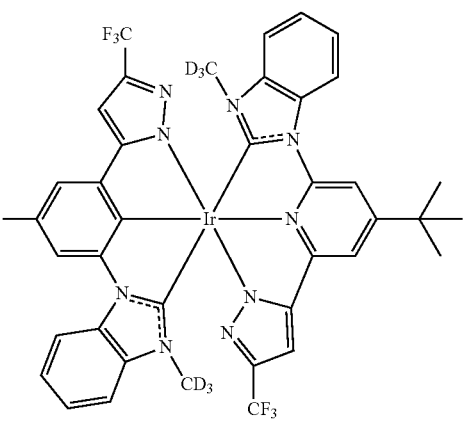
5
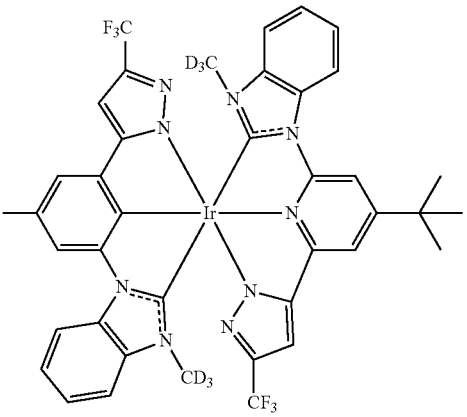
6

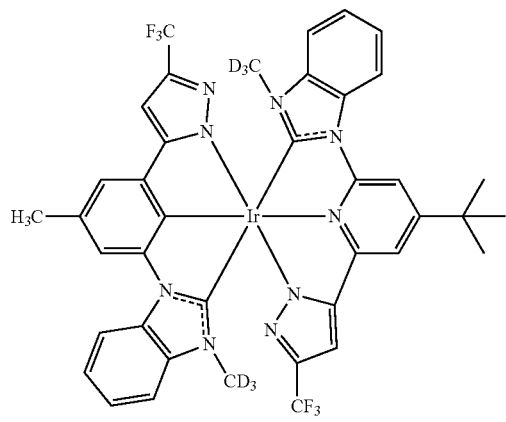
7
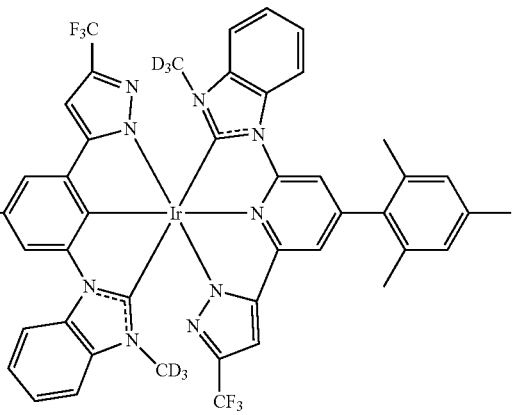
11
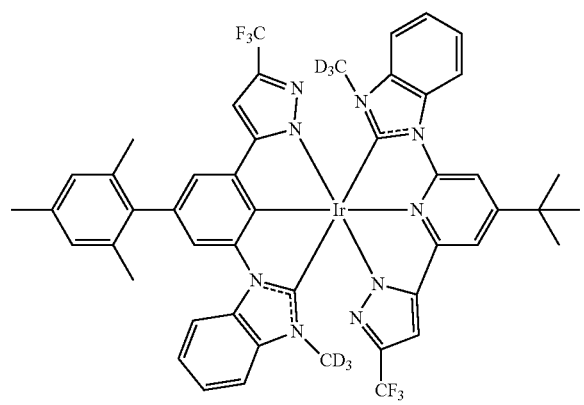
8
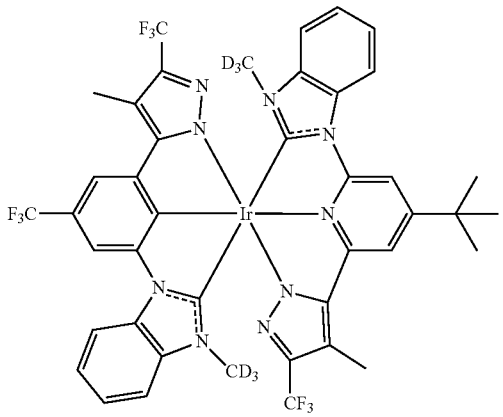
12
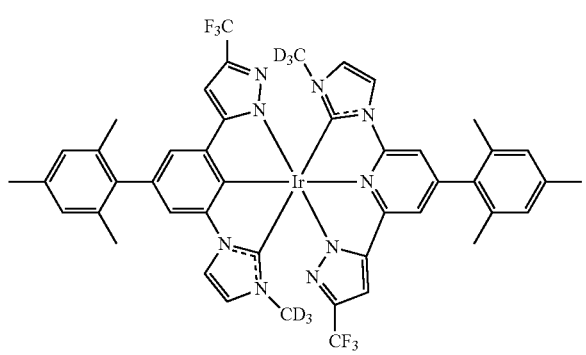
9
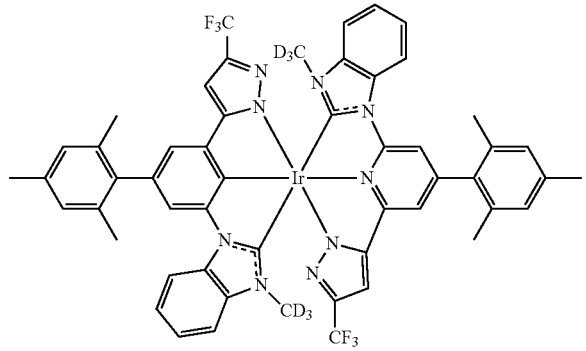
10
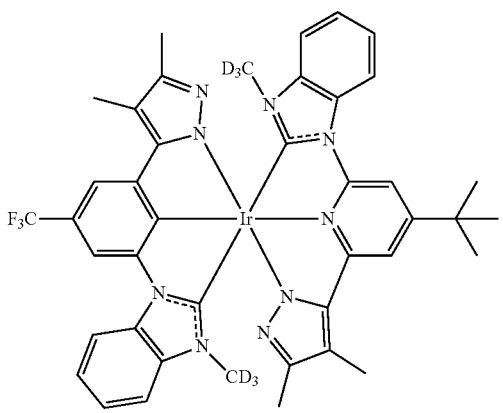
13

-continued
14
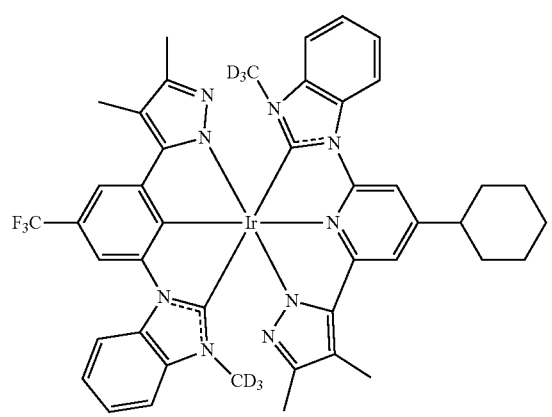
15
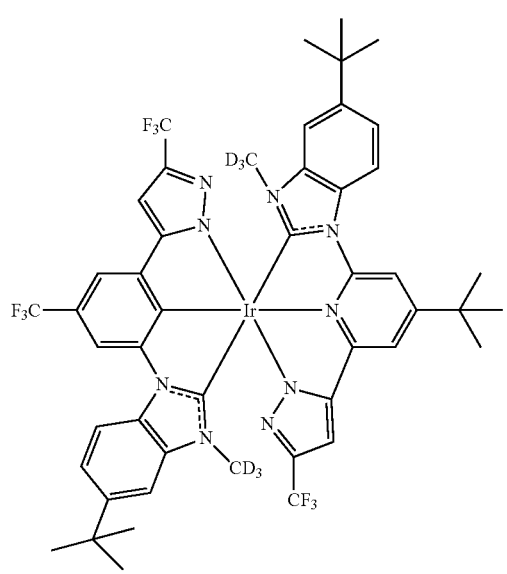
16
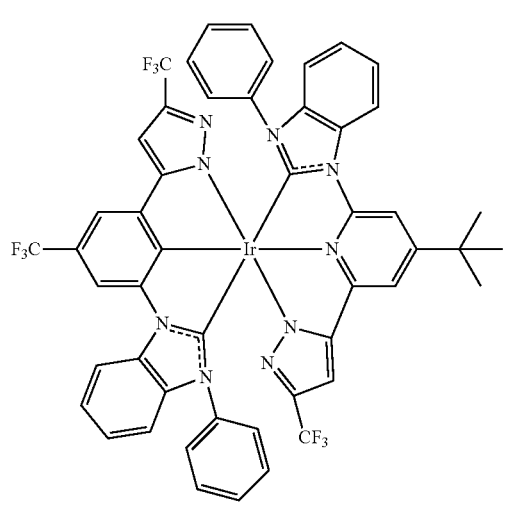
-continued
17
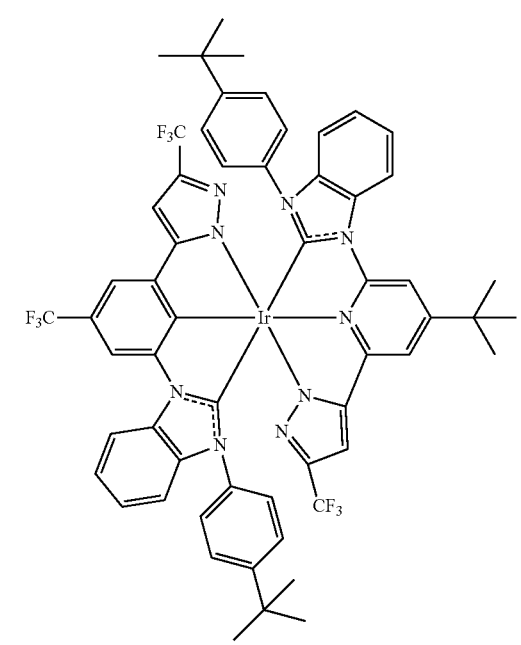
18
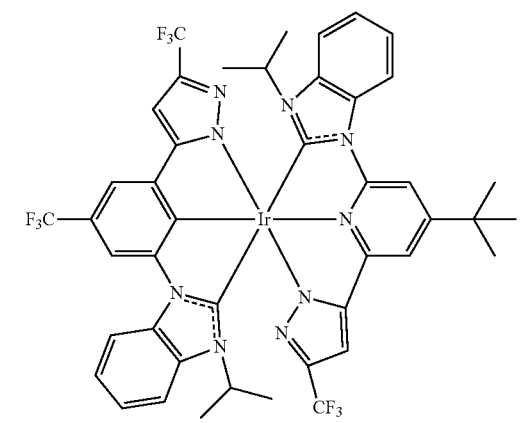
19
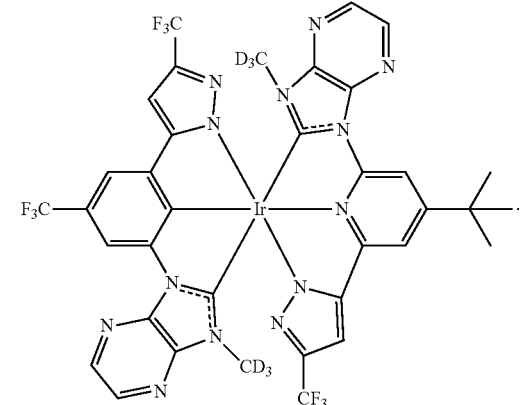
* * * * *